(12) United States Patent
Eisenberg

(10) Patent No.: US 11,627,675 B2
(45) Date of Patent: Apr. 11, 2023

(54) EXTENSIBLE DISPLAY SCREEN APPARATUS FOR MOBILE ELECTRONIC DEVICE

(71) Applicant: David Eisenberg, Tustin, CA (US)

(72) Inventor: David Eisenberg, Tustin, CA (US)

( * ) Notice: Subject to any disclaimer, the term of this patent is extended or adjusted under 35 U.S.C. 154(b) by 0 days.

(21) Appl. No.: 17/384,687

(22) Filed: Jul. 23, 2021

(65) Prior Publication Data

US 2023/0022114 A1      Jan. 26, 2023

(51) Int. Cl.
G06F 1/16      (2006.01)
H05K 5/02      (2006.01)

(52) U.S. Cl.
CPC ......... *H05K 5/0217* (2013.01); *G06F 1/1624* (2013.01); *G06F 1/1647* (2013.01)

(58) Field of Classification Search
CPC .... G06F 1/1624; G06F 1/1647; G06F 1/1616; G06F 1/1618; G06F 1/1681; H05K 5/0217

See application file for complete search history.

(56) References Cited

U.S. PATENT DOCUMENTS

| | | | | |
|---|---|---|---|---|
| 6,643,124 B1* | 11/2003 | Wilk | ................... | H04M 1/0247 345/169 |
| 6,859,219 B1* | 2/2005 | Sall | ...................... | G06F 1/1683 345/905 |
| 7,752,789 B2* | 7/2010 | Sun | ..................... | F16M 11/045 211/151 |
| 8,018,715 B2* | 9/2011 | Chang | ................... | G06F 1/1647 361/679.04 |
| 8,379,377 B2* | 2/2013 | Walters | ................. | G06F 1/1652 361/679.04 |
| 10,082,832 B1* | 9/2018 | Wang | ..................... | G06F 1/1681 |
| 10,817,020 B1* | 10/2020 | DeMaio | ................ | G06F 3/1423 |
| 2006/0082518 A1* | 4/2006 | Ram | ..................... | G06F 1/1635 345/1.1 |
| 2006/0268500 A1* | 11/2006 | Kuhn | .................... | G06F 1/1649 361/679.04 |
| 2007/0247798 A1* | 10/2007 | Scott, II | ................ | G06F 1/1647 361/679.04 |
| 2010/0124006 A1* | 5/2010 | Chang | ................... | G06F 1/1624 361/679.04 |
| 2013/0077228 A1* | 3/2013 | Batio | .................... | G06F 1/1641 361/679.29 |

(Continued)

*Primary Examiner* — Hung S. Bui
*Assistant Examiner* — Sagar Shrestha
(74) *Attorney, Agent, or Firm* — Raymond Y. Chan; David and Raymond Patent Firm

(57) ABSTRACT

An extensible display screen apparatus includes a power supply device and a screen display device. The screen display device includes at least one screen unit and a screen support assembly, wherein the at least one screen unit is disposed on the screen support assembly and the screen support assembly is arranged to support the at least one screen unit, whereas the at least one screen support assembly can electrically connect with the screen display device through the power supply device. The power supply device is configured to provide a working power to the at least one screen unit for a mobile electronic device to communicate with the at least one screen unit, wherein the said screen unit provides additional information of the mobile electronic device while being electrically connected with the screen display device.

11 Claims, 16 Drawing Sheets

(56) References Cited

U.S. PATENT DOCUMENTS

| | | | |
|---|---|---|---|
| 2014/0218857 A1* | 8/2014 | Liu | G06F 1/1684 |
| | | | 361/679.27 |
| 2018/0039300 A1* | 2/2018 | Gonzalez, III | G06F 1/1643 |
| 2019/0294400 A1* | 9/2019 | Lee | G06F 9/543 |
| 2020/0278722 A1* | 9/2020 | Hudgins | H05K 5/0247 |
| 2020/0409645 A1* | 12/2020 | Clark | G06F 3/1423 |
| 2020/0412132 A1* | 12/2020 | Kristjansson | H02J 7/008 |
| 2021/0041915 A1* | 2/2021 | Moser | G06F 1/1649 |
| 2021/0080999 A1* | 3/2021 | Bryant | F16M 13/005 |
| 2021/0405702 A1* | 12/2021 | Hudgins | G06F 1/166 |
| 2022/0117100 A1* | 4/2022 | Yoon | G06F 1/1624 |
| 2022/0147098 A1* | 5/2022 | Stewart | G06F 1/1624 |

* cited by examiner

EXTENSIBLE DISPLAY SCREEN APPARATUS FOR MOBILE ELECTRONIC DEVICE

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention is related to an electronic accessories device, and more particularly to an extensible display screen apparatus for a mobile electronic device, which can be used as a mobile (smart) accessories device, that allows the display interface of the mobile electronic device to be displayed on the extensible display screen apparatus after the extensible screen display apparatus is paired with the mobile electronic device.

Description of Related Arts

Mobile electronic devices, especially cell phones, smart watches, tablets and notebooks, have become essential electronic devices. They are important devices for people to use for social networking, daily working and for gathering information through the Internet, and the technology is continuously innovating. Taking a cell phone for example, more and more functions are becoming integrated into cell phones, such as web video browsing, video calling, video conferencing, and performing work online and etc.

With continuous advances, there is a demand in the market for mobile devices being lighter, thinner and miniaturized, but the relatively smaller screen size of the mobile device also substantially limits a user's needs and operation. Although a folding screen electronic device may temporary meet the user's needs up to certain extent, in face of the need for larger screen, an auxiliary electronic device with external screens is still a a need in the market. Existing external screen technology display devices such as projectors, desktop monitors, and wall-mounted displays are able to meet the user's needs for extended screens to a certain extent. However, such external screen technology wouldn't compliment the use of a mobile electronic device, such as a portability requirement because it is difficult for users to carry any bulky external screen.

On the other hand, the conventional auxiliary screen equipment still needs to connect with external power supply. For example, a projector or a desktop monitor needs an external power source or mobile electronic device to provide power during use, such as the power supply to notebook or tablet. Moreover, the traditional auxiliary screen still requires external power supply during use, which causes an inconvenience for users.

SUMMARY OF THE PRESENT INVENTION

The invention is advantageous in that it provides an extensible display screen apparatus which can be paired with a mobile electronic device, such as a cell phone, a smartwatch, a tablet or a notebook, to provide display interface information for the mobile electronic device, so as to improve and benefit the display function and capability of the mobile electronic device.

Another advantage of the invention is to provide an extensible display screen apparatus for mobile electronic equipment, which includes a screen display device and at least one power supply device electronically connected to the screen display device, wherein the power supply device provides a working power for the screen display device. Therefore, the extensible display screen apparatus does not require an external working power source that substantially improves the working portability for the screen display device.

Another advantage of the invention is to provide an extensible display screen apparatus for mobile electronic device, wherein the screen display device is configured to be detachably connected with the power supply device, such that the user can choose to supply the power from the power supply device to the extensible display screen apparatus or from the mobile electronic equipment that, for example, notebook's power supply is beneficial to improve the applicability of the extensible display screen apparatus.

Another advantage of the invention is to provide an extensible display screen apparatus for mobile electronic device, wherein the power supply device of the extensible display screen apparatus is provided with at least one device port configured for electrically connecting to the power supply device of the extensible screen display apparatus through the device port, so that the extensible screen display apparatus is able to be powered up through the mobile electronic device.

Another advantage of the invention is to provide an extensible display screen apparatus for mobile electronic device, wherein the mobile electronic device can be communicatively connected with the extensible display screen apparatus through a wireless connection, for example through WiFi, Bluetooth, 5G, or 6G etc., that is useful to improve the applicability of the extensible display screen apparatus.

Another advantage of the invention is to provide an extensible display screen apparatus for mobile electronic device, wherein the screen display device includes one or more one screen units, the one or more screen units are configured to be communicatively connected with the mobile electronic device, such that the display interface of the mobile electronic device is capable of displaying via the one or more screen units.

Another advantage of the invention is to provide an extensible display screen apparatus for mobile electronic device, wherein the screen display device includes two or more screen units which can be separated into two or three independently that each of the screen units can be functioned individually or combined into a single large screen. In other words, the display information from the mobile electronic device can be individually or repeatedly displayed on each of the screen units, or the display information is displayed in the larger screen combined by two or more screen units or spliced by the second or third screen unit.

Another advantage of the invention is to provide an extensible display screen apparatus for mobile electronic device, which further includes a docking element device that can pair with the mobile electronic device and connect to the screen display device.

Another advantage of the invention is to provide an extensible display screen apparatus for mobile electronic device, wherein the docking element device is the NFC component, through the docking element device, the extensible display screen apparatus and the mobile electronic device can be paired and connected as quickly as possible within the range through the docking element device.

Another advantage of the invention is to provide an extensible display screen apparatus for mobile electronic device, wherein the screen display device of the extensible display screen apparatus includes at least a pivot member for pivotally connecting the respective screen unit to facilitate adjustment of the orientation and angle of the display screen unit.

Another advantage of the invention is to provide an extensible display screen apparatus for mobile electronic device, wherein the height of the screen display device can be adjusted to adopt to different heights, which improve the applicability of the extensible display screen apparatus.

Another advantage of the invention is to provide an extensible display screen apparatus for mobile electronic device, which further includes a driving motor, such that the movement of the screen unit to realize the opening and closing or folding of the screen unit is driven by the driving motor, with the extensible display screen apparatus is allowed to use a single screen unit, a second screen unit or a third screen unit.

Additional advantages and features of the invention will become apparent from the description which follows, and may be realized by means of the instrumentalities and combinations particular point out in the appended claims.

According to the present invention, the foregoing and other objects and advantages are attained by an extensible display screen apparatus for mobile electronic device, which comprises:

a power supply device; and a screen display device, which includes at least one screen unit and a screen support assembly, wherein the at least one screen unit is disposed and on the screen support assembly and the screen support assembly is arranged to support the at least one screen unit in such a manner that the at least one screen support assembly is able to electrically connect with the at least one screen unit through the power supply device, wherein the power supply device is configured to provide a working power to the at least one screen unit for the mobile electronic device to communicate with the at least one screen unit and the at least one screen unit provides additional display information of the mobile electronic device while electrically connected with the at least one screen unit.

According to one embodiment of the present invention, the extensible screen apparatus further comprises a data transmission unit electrically connected to the power supply device and the screen display device, wherein through the data transmission unit, the screen display device is communicably connected to the mobile electronic device such that the data transmission unit transmits display information of the mobile electronic device to the screen display device.

According to one embodiment of the present invention, the screen unit includes at least a first screen unit and a second screen unit, wherein the first screen unit and the second screen unit are arranged on the screen support assembly in an extensible and retractable manner.

According to one embodiment of the present invention, the screen unit is arranged to be switched between an extended state and a retracted state. In one embodiment, when both the first and second screen units are in the extended state, the first screen unit and the second screen unit are extended outwardly from an accommodation space of the screen support assembly so as to expand display interfaces of the screen units, when the first and second screen units are in the expanded state, the first screen unit and the second screen unit are retracted to be received in the accommodation space of the screen support assembly.

According to one embodiment of the present invention, the first and second screen units are adjusted from the extended state to the retracted state, the first screen unit and the second screen unit are stacked overlappedly in a back-and-forth manner, wherein the first screen unit is retracted behind the second screen unit.

According to one embodiment of the present invention, when the first and second screen units are adjusted from the extended state to the retracted state, the first screen unit and the second screen unit are staggeringly moved with respect to each other in opposite directions simultaneously until the first screen unit and the second screen unit are overlapped with each other to back and forth positions respectively.

According to one embodiment of the present invention, the screen support assembly includes a support base and a support back panel and forms an accommodation space for receiving and supporting the at least one screen units, wherein at least one screen unit is retained by the support base and the support back panel of the screen support assembly within the accommodation space.

According to one embodiment of the present invention, the supporting base has a first track and a second track, wherein the first screen unit is movable and arranged on the first track of the support base and the second screen unit is movable and arranged on the second track of the support base, wherein the first track and the second track are arranged adjacent and spaced apart from each other while allowing both the first screen unit and the second screen unit to move back and forth reciprocatingly and staggerly with each other in predetermined direction with respect to the supporting base.

According to one embodiment of the present invention, the screen support assembly further includes a linkage element, which is arranged on the support base and positioned between the first track and the second track, such that the first screen unit and the second screen unit are movably connected through the linkage element while the linkage element is able to drivingly link the first screen unit and the second screen unit.

According to one embodiment of the present invention, the linkage element is embodied as gear and the first screen unit and the second screen unit are positioned on both sides of the gear and configured to mesh with the gear.

According to one embodiment of the present invention, the power supply device includes a power supply housing, at least one power supply unit arranged in the power supply housing, and a supporting shaft which is pivotally arranged at one end of the power supply housing, wherein the power supply unit is electrically connected to the display screen device by the supporting shaft.

According to one embodiment of the present invention, the power supply device further has at least one equipment port electrically connected to at least one power supply unit for electrically connecting a mobile electronic device with at least one power supply unit therethrough so as to supply power to the mobile electronic device by the power supply unit via the equipment port.

According to one embodiment of the present invention, the power supply device further has at least one charging port and includes a control circuit board, wherein the charging port is configured for charging the power supply unit of the power supply device through the control circuit board.

According to one embodiment of the present invention, the supporting shaft includes a shaft body and an electrical connection element arranged on the shaft body, wherein the electrical connected element is electrically connected to at least one power supply unit and the screen display device is electrically connected to the at least one power supply unit by the electrical connection element.

According to one embodiment of the present invention, the shaft body supporting the connecting shaft is pivotally arranged on the power supply housing, and the electrical connection element is fixed to the shaft body and protrudes outwardly from the shaft body, so that the electrical connection element can be adapted to an interface of the screen display device and allow the supporting shaft supporting the screen device to rotate in a circumferential direction where the shaft body located.

According to one embodiment of the present invention, the extensible display screen apparatus further includes a device docking element, wherein the device docking element is communicably connected to the screen display device and electrically connected to the power supply device, wherein the mobile electronic device and the screen display device are paired through the device docking element, allowing the mobile electronic device to transmit display information to the screen device.

According to one embodiment of the present invention, in the extended state, the first screen display unit and the second screen display unit extend from the outer edge of the screen support assembly to both sides thereof.

According to one embodiment of the present invention, the screen support assembly has an accommodation space and a sliding slot, wherein the first screen unit and the second screen unit are arranged side by side in the sliding slot of the screen support assembly in order to allow the first screen unit and the second screen unit to slide to both sides of the sliding slot that the first screen unit and the second screen unit are directed from the screen support assembly to extend at both sides thereof.

According to one embodiment of the present invention, the extensible display screen apparatus further includes at least one extensible frame, wherein one end of the extensible frame is fixed to one side of the power supply device, another end of the extensible frame is configured extensible with respect to the power supply device, wherein the screen display device is arranged on the extensible frame and a height of the screen display device can be adjusted by the extensible frame.

According to one embodiment of the present invention, the extensible display screen apparatus further includes an electric driver, which is electrically connected with the power supply device, wherein the power supply device provides a working power to the electric driver, wherein electric driver and the screen display device are transmissibly linked with each other such that the screen display device is able to be driven to move by the electric driver.

According to one embodiment of the present invention, each of the screen units further includes at least one pivotal connecting member, which is arranged to pivotally connect the first screen unit and the second screen unit, allowing the first screen unit and the second screen unit extend from both sides of the pivot connecting member respectively.

According to one embodiment of the present invention, the pivotal connecting member is embodied as a hinge mechanism.

According to one embodiment of the present invention, the screen supporting assembly includes a supporting base and a supporting back panel, wherein the supporting back panel is fixed to an upper end of the supporting base, wherein the first screen unit is fixed to the supporting back panel while the second screen unit is connected and supported by the pivotal connecting member. Also, the second screen unit has a folding position and at least one unfolding position, wherein when the second screen unit is rotated to the folding position, the second screen unit and the first screen unit are opposing and overlapping with each other, and that when the second screen unit is rotated to the unfolded position, the second screen unit is supported by the first screen unit and extends outwardly with respect to the first screen unit.

According to one embodiment of the present invention, the screen display device further includes a third screen unit, wherein the second screen unit and the third screen unit are configured to be provided on both sides of the first screen unit respectively and being connected to the first screen unit through the pivotal connecting member.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

Figure 1:
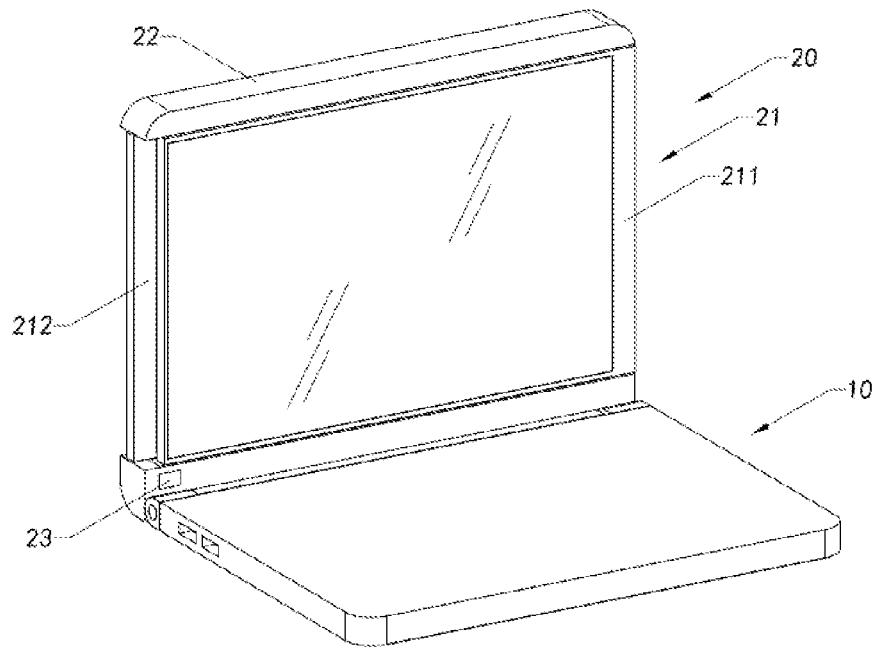
FIG. 1 is a perspective view of an extensible display screen apparatus according to a first preferred embodiment of the present invention.

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

The skilled technicians in the art should understand that, in the disclosure of this present invention the technical terms, "longitudinal", "lateral", "upper", "lower", "front", "rear", "left", "right", the orientation or positional relationship indicated by "vertical", "horizontal", "top", "bottom", "inner", "outer", etc. are based on the orientation or positional relationship shown in the drawings, this is only for the convenience and simplifying the description for the present invention, it does not indicate or imply that the pointed device or element must have a specific orientation, be constructed and operated in a specific orientation, so the above terms should not be understood as a limitation of the present invention.

It can be explained that the term "a" should understood as "at least one" or "one or more", that is, in one embodiment, the number of an element can be one, and in another embodiment, the number of the element can be multiple, and the term "one" cannot be understood as a limitation on the number.

Referring to FIGS. 1 to 5D of the present invention, an extensible display screen apparatus for mobile electronic device according to a first preferred embodiment of the present invention is illustrated. The extensible display screen apparatus is adapted to pair with a predetermined mobile electronic device, such as cell phone, notebook, tables, and smart device, or other personal electronic communication or data operation devices. After the mobile electronic device is paired with the extensible display screen device, the mobile electronic device is configured to provide display information thereof for the extensible display screen apparatus to display so as to extend the display interface of the mobile electronic device. In other words, the display interface of the mobile electronic device is transmitted to the extensible display screen apparatus.

The extensible display screen apparatus includes a power supply device 10 and at least one screen display device 20 electrically connected to the power supply device 10. When the extensible display screen apparatus is paired and connected with the mobile electronic device either wirely or wirelessly, the display information of the mobile electronic device is transmitted to the at least one screen display device 20. The power supply device 10 is configured to provide working power for the at least one screen display device 20. Therefore, the power supply device 10 can provide power for working and operation to the screen display device 20 without any external power supply. Alternatively, the power supply device 10 may also configured to electrically connect with an external power supply to supply power for the screen display device 20 or with the mobile electronic device to use the power supply thereof to provide working power for the screen display device 20 from the mobile electronic device electrically connected.

The screen display device 20 is detachably connected to the power supply device 10, so that the user can choose to use the power supply device 10 to provide working power for the screen display device 20, or when the screen display device 20 and the power supply device 10 are detached and separated, the screen display device 20 is paired with the mobile electronic device and uses an external power supply to supply power.

Preferably, in the first preferred embodiment of the present invention, the screen display device 20 is electrically connected with the power supply device 10, wherein the screen display device 20 is positioned at one end or one side of the power supply device 10 or the screen display device 20 is plugged in an upper end terminal of the power supply unit 10. Preferably, the screen display device 20 is installed at a front end of the power supply device 10.

The screen display device 20 includes at least one screen assembly 21 and a screen support assembly 22 supporting the screen assembly 21, wherein the at least one screen assembly 21 is arranged on the screen support assembly 22 and supported by the screen support assembly 22 so as to retain a predetermined display state. In this preferred embodiment of the present invention, the screen display device 20 may include two, three, four or more screen assembly 21, which can be stored and received in the screen support assembly 22 in a manner of folding, swinging, rotating, or sliding, so that the screen assembly 21 is protected by the screen support assembly 22 when it is not use. It is understood that the at least one screen assembly 21 is received and stored in the screen support assembly 22, that can effectively reduce the overall size of the screen display device 20 and facilitate storage to prevent the screen display device 20 from being damaged in the unfolded state.

For example, according to the first preferred embodiment of the present invention, the screen assembly 21 of the display screen device 20 includes a first screen unit 211 and a second screen unit 212, wherein the first screen unit 211 and the second screen unit 212 are slidably mounted on the screen support assembly 22, such that the screen assembly 21 is supported and protected by the screen support assembly 22.

It is worth mentioning that, according to the preferred embodiment of the present invention, the screen assembly 21 can be communicatively connected with the mobile electronic device wirely via data cable, through which the mobile electronic device transmits display information to the screen assembly 21. The screen display device 20 can be connected to the external mobile electronic device through a wireless connection. Correspondingly, the screen display device 20 further includes at least one data transmission unit 23 communicatively connected the screen assembly 21 with the mobile electronic device, and the data transmission unit 23 transmits the display information of the mobile electronic device to the screen assembly 21. The data transmission unit 23 can be implemented as a wireless data transmission element, such as WiFi network data transmission element, a Bluetooth data transmission element, 5G, 6G, and other network connection elements, a screen mirroring data transmission element, and a projection data transmission element, etc. It can be understood that, in this preferred embodiment of the present invention, the specific implementation of the data transmission unit 23 is not limited here.

In other embodiments of the present invention, the data transmission unit 23 can be implemented as a built-in docking station, wherein the built-in docking station is arranged on the screen support assembly 22 of the screen display device 20 or the power supply device 10, and the screen assembly 21 is communicatively connected to the mobile electronic device through the built-in docking station. It can be explained that the mobile electronic device, such as a notebook, can be communicatively connected to the data transmission unit 23 of the screen display device 20, and the mobile electronic device transmits display data information to the screen assembly 21 of the screen display device 20 through the data transmission unit 23.

In particular, the preferred embodiment of the present invention, the mobile electronic device is communicatively connected with the screen assembly 21 of the screen display device 20 through the data transmission unit 23, so the mobile electronic device transmits the display information to the screen assembly 21 of the screen display device 20 through wireless transmission.

The first screen unit 211 and the second screen unit 212 of the screen assembly 21 are configured to be selected to use only one screen unit thereof or to use the first screen unit 211 and the second screen unit 212 in combination.

The first screen unit 211 and the second screen unit 212 of the screen assembly 21 are extensibly supported by the screen support assembly 22 and received in a accommodation space of the screen support assembly 22 in such a manner that the screen assembly 21 is capable of switching between an extended state and a retracted state. When the screen assembly 21 is in the extended state, at least one of the first screen unit 211 and the second screen unit 212 extends outwardly from the accommodation space of the screen support assembly 22 to expand viewable area of the screen assembly 21.

When the screen assembly 21 is in the retracted state, the first screen unit 211 and/or the second screen unit 212 of the screen assembly 21 are retracted to the accommodation space of the screen support assembly 22 to reduce an overall size of the screen display device 20 to a portable compact size for ease of storage and carrying.

Figure 3A:
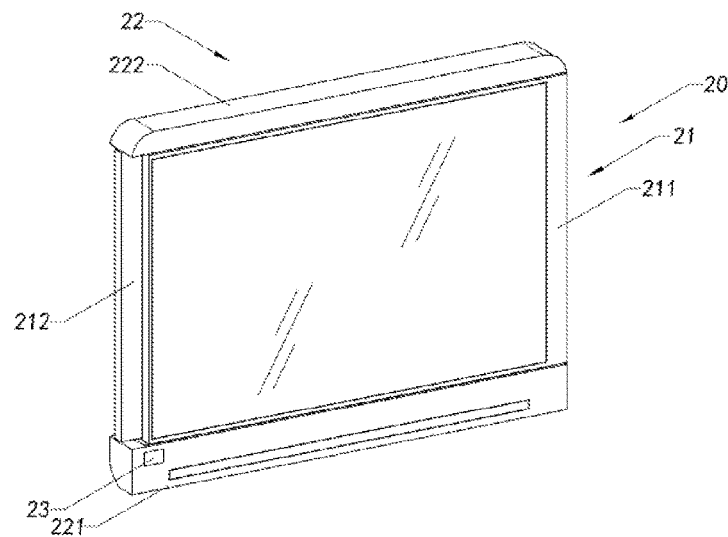
FIGS. 3A and 3B are schematic views of the screen display device of the extensible display screen apparatus according to the above first preferred embodiment of the present invention.
Figure 3B:
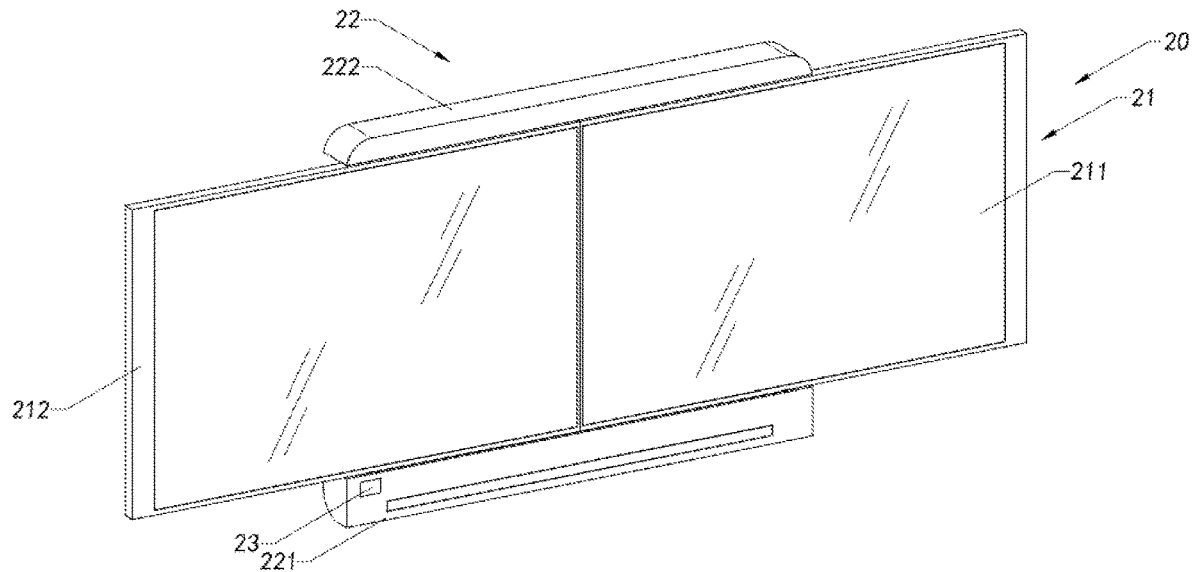

It is worth mentioning that, according to the first preferred embodiment of the present invention, as illustrated in FIGS. 3A and 3B, when the screen assembly 21 is in the retracted state, the first screen unit 211 and the second screen unit 212 are stacked overlappedly in a back-and-forth manner, wherein the first screen unit 211 is retracted behind the second screen unit 212. Or, alternatively, the second screen unit 212 is retracted behind the first screen unit 211. Alternatively, the first screen unit 211, and the second screen unit are staggeringly moved with respect to each other in opposite directions simultaneously until the first screen unit 211 and the second screen unit 212 are overlapped with each other to back and forth positions respectively.

Figure 4A:
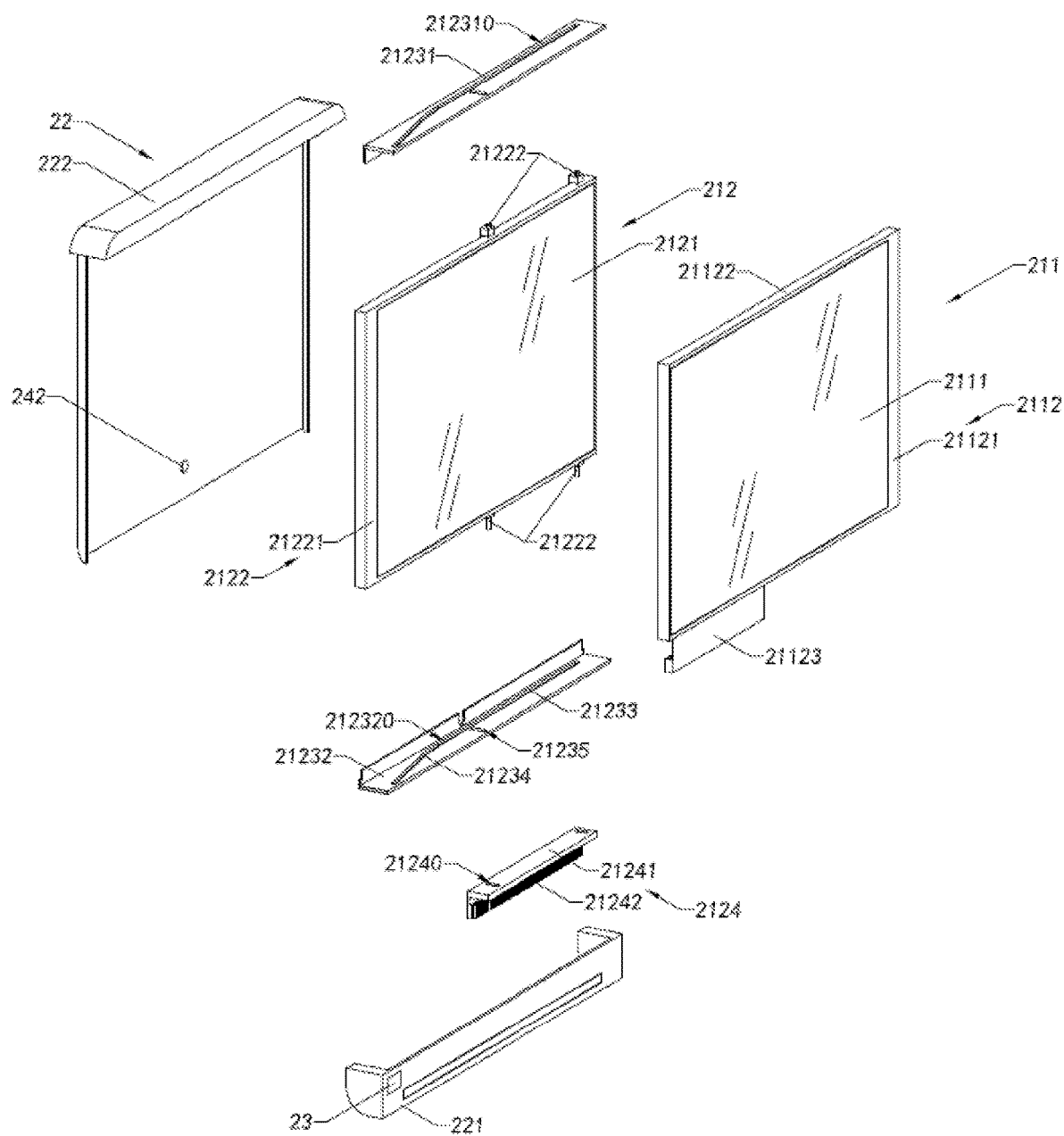
FIGS. 4A and 4B are exploded views of the extensible display screen apparatus according to the above first preferred embodiment of the present invention.
Figure 4B:
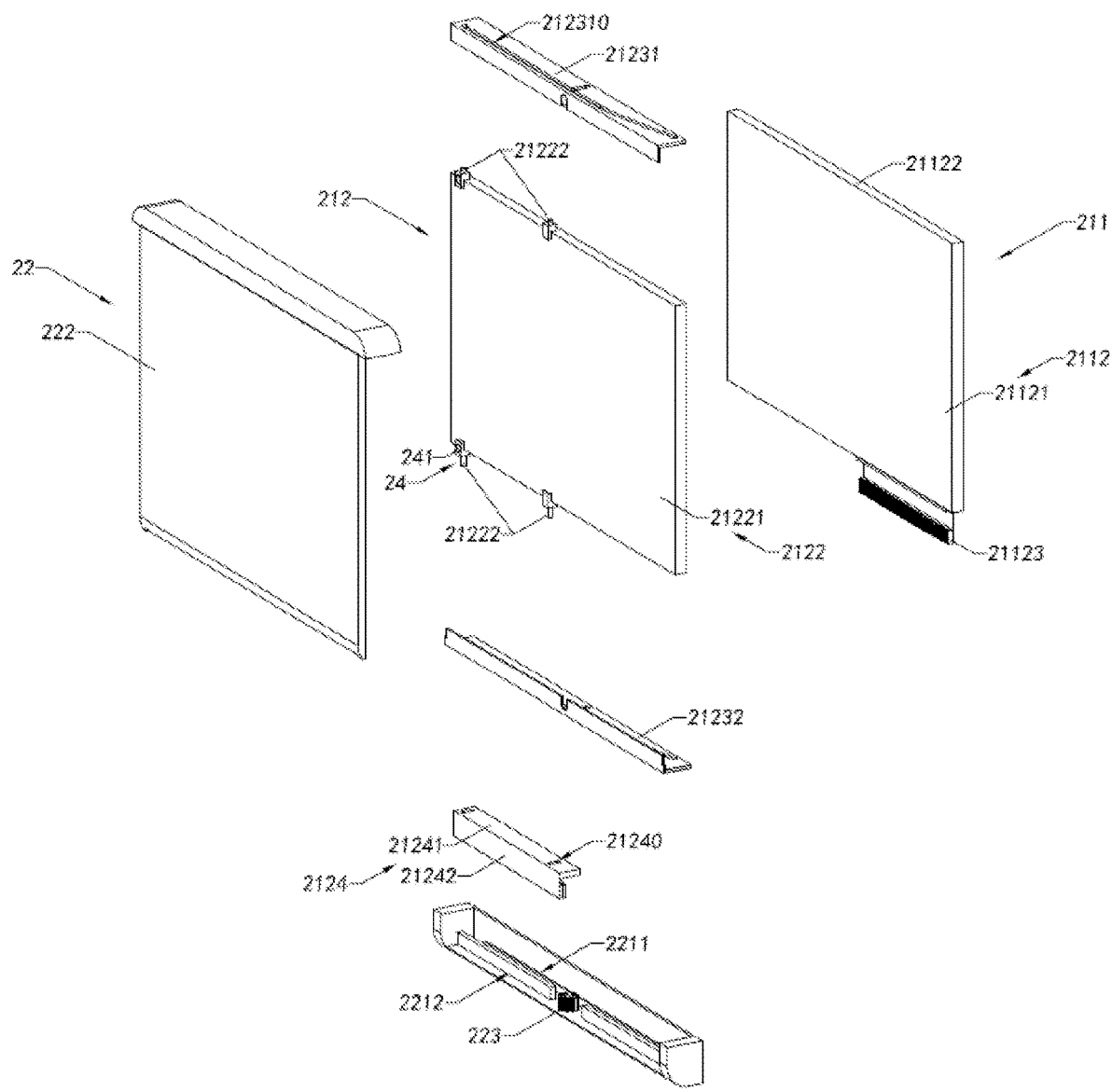

Referring to FIGS. 4A and 4B, the screen support assembly 22 includes a support base 221 and a support back frame 222, wherein the support base 221 and the support back frame 222 of the screen support assembly 22 define and form the accommodating space therein for receiving and supporting the screen assembly 21, such that the screen assembly 21 is able to be retained in the accommodation space defined by the support base 221 and the support backplane 222 of the screen support assembly 22. The support base 221 of the screen support assembly 22 provides a first track 2211 and a second track 2212, wherein the first screen unit 211 and the second screen unit 212 of the screen assembly 21 are movably disposed on the first track 2211 and the second track 2212 of the support base 221 respectively, while the first screen unit 211 is allowed to move reciprocatingly back and forth in a specific direction along the first track 2211 and the second screen unit 212 is allowed to move reciprocatingly back and forth in a specific direction along the second track 2212.

It is worth mentioning that, according to the first preferred embodiment of the present invention, each of the first track 2211 and the second track 2212 of the screen support assembly 22 can be implemented as slot, groove or guide rail track, wherein the screen assembly 21 is configured with respect to the screen support assembly 22 such that the first and second screen units 211, 212 of the screen assembly 21 can move in parallel along the first and second tracks 2211, 2212 respectively to adjust their positions.

The first track 2211 and the second track 2212 of the support base 221 are preferred to be spaced apart from each other, and that the first screen unit 211 and the second screen unit 212 are arranged to move and link to each other in configuration, such that the movement of the first screen unit 211 along the first track 2211 and the movement of the second screen unit 2212 along the second track 2212 are linked to move in opposing directions, such as the first and second screen units 211, 212 moving towards each other to the retracted state or moving away from each other to the extended state, i.e. allowing the first screen unit 211 and the second screen unit 212 to switch between the extended state and the retracted state. Accordingly, the first screen unit 211 and the second screen unit 212 are able to move in opposite directions, moving away from each other, so as to switch the first and second screen units 211, 212 from the retracted state, where the first and second screen units 211, 212 are disposed overlappedly within the accommodation space of the screen support assembly 22, as shown in FIG. 3A, to the extended state that the first and second screen units 211, 212 are fully extended to both sides of the screen support assembly 22, as shown in FIG. 3B.

Preferably, referring to FIGS. 4A to 5D, according to the first preferred embodiment of the present invention, the first screen unit 211 and the second screen unit 212 are linked with each other through a gear linkage. In particular, the screen support assembly 22 includes a linkage element 223 rotatably mounted on the support base 221 and positioned between the first track 2211 and the second track 2212 that the first screen unit 211 and the second screen unit 212 are respectively drivably coupled with the linkage element 223 in such a manner that a lateral movement of each of the first and second screen units 211, 212 along the first and second tracks 2211, 2212 drives the other first and second screen units 211, 212 to move correspondingly through the linkage element 223.

Figure 5A:
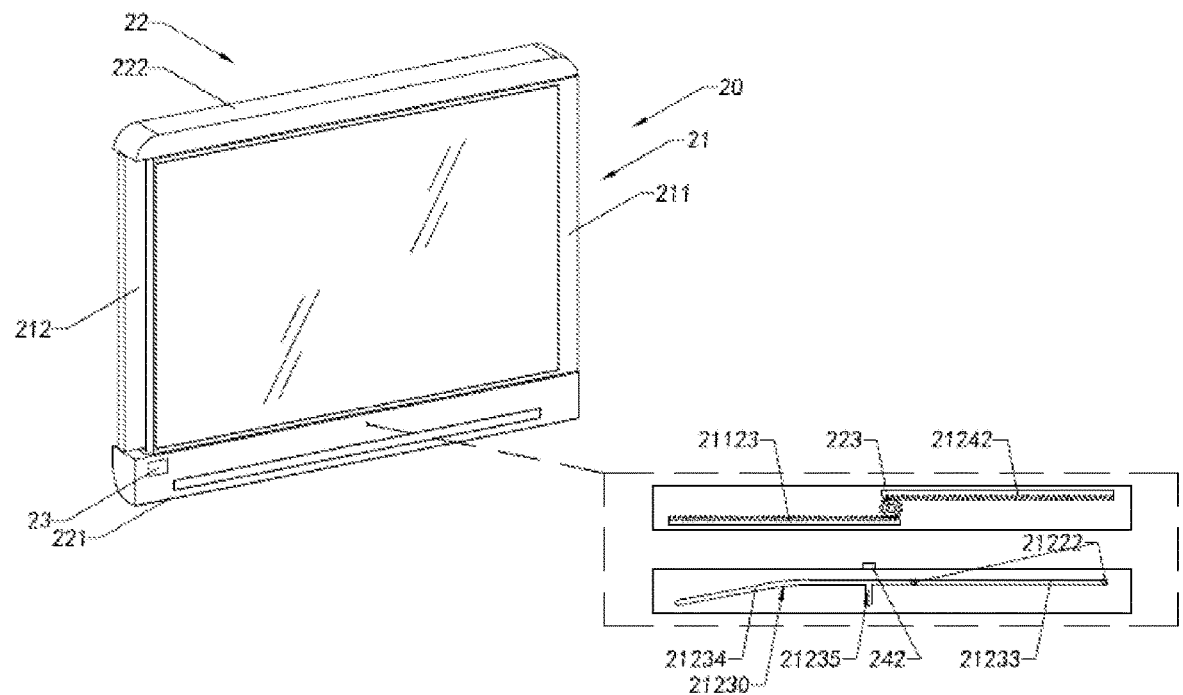
FIGS. 5A to 5D are schematic views illustrating the extending of the screen display device of the extensible display screen apparatus according to the above first preferred embodiment of the present invention.
Figure 5B:
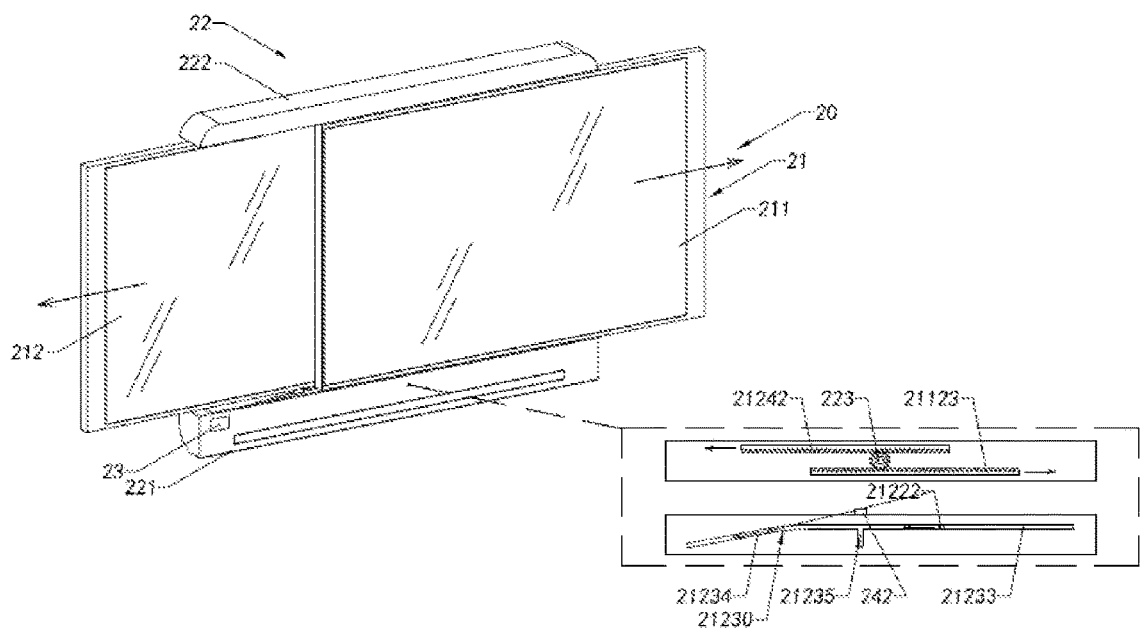
Figure 5C:
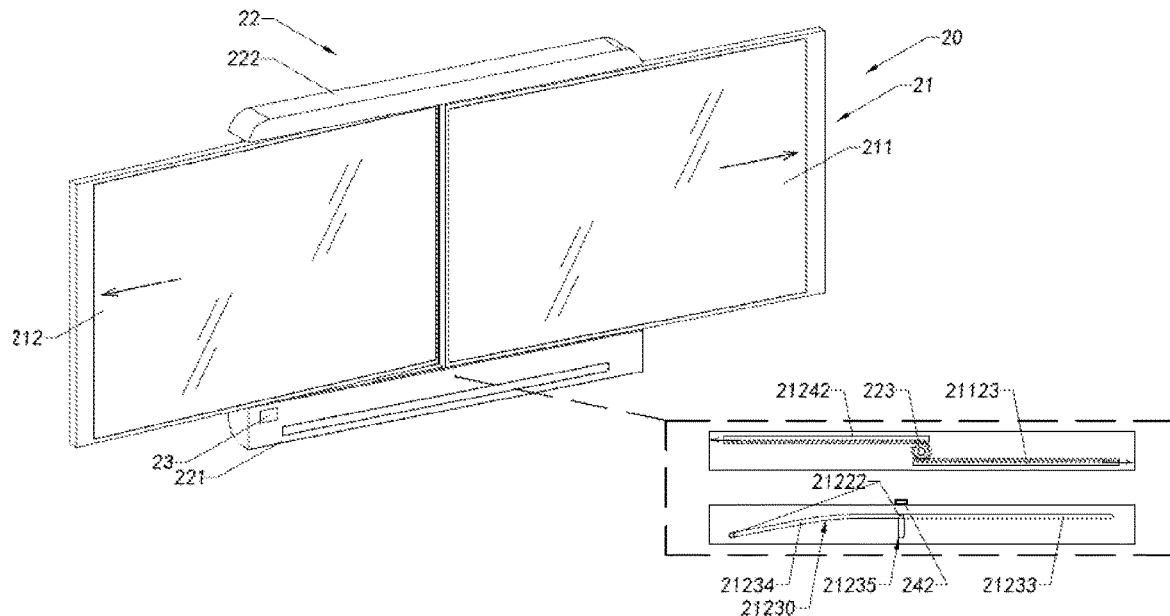
Figure 5D:
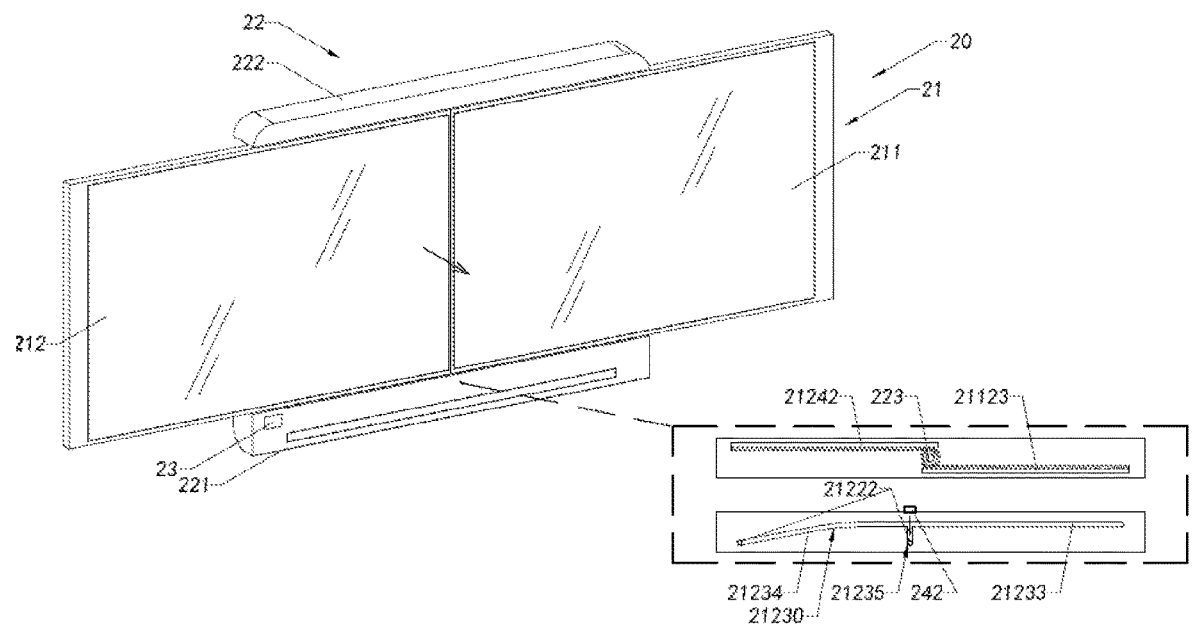

Preferably, in this preferred embodiment of the present invention, the linkage element 223 is embodied as a gear element, wherein the first screen unit 211 and the second screen unit 212 each provides an elongated linkage portion meshed with the linkage element 223 while the first screen unit 211 and the second screen unit 212 are movably located on both sides of the linkage element 223. Through the linkage element 223, the first screen unit 211 and the second screen unit 212 are able to perform linkage reciprocating movement with respect to each other. When the first screen unit 211 is driven to move in a specific direction, the linkage portion of the first screen unit 211 drives the linkage element 223 to rotate and drive the linkage portion of the second screen unit 212 positioned behind the first screen unit 211 to move in an opposite direction and thus driving the second screen unit 212 to move in opposite direction with respect to the first screen unit 211 so as to extend or retract the first and second screen units 211, 212 of the screen assembly 21 to the extended state as shown in FIGS. 3B, 5D or the retracted state as shown in FIGS. 3A and 5A.

Accordingly, the first screen unit 211 includes a first display element 2111 and a first screen support 2112 configured to mount the first display element 2111 in position, wherein the first display element 2111 provides a display interface according to the display information of the mobile electronic device to be displayed. The first display element 2111 can be, but not limited to, a CRT display (Picture Tube Display), a LCD display (Liquid Crystal Display) or a LED display, wherein the first display element 2111 is rigidly supported by the first display screen support 2112 to form the first screen unit 211 such that the first display element 2111 and the first display frame 2112 move synchronously. It is worth mentioning that, in some embodiments of the present invention, the first display element 2111 may be implemented as an electronic device with a display function, such as a tablet computer or a panel monitor.

Preferably, in this preferred embodiment of the present invention, the first display element 2111 and the first screen support 2112 are embodied to be fixedly connected by a buckle. Therefore, it can be understood that the first display element 2111 is detachably mounted on the first screen support.

The first screen support 2112 further includes a first support body 21121, at least one first guide element 21122 and at least one first transmission rack 21123 provided on the first support body 21121, wherein the first guide element 21122 and the first transmission rack 21123 are provided on two opposing sides of the first support body 21121 respectively. Preferably, the first transmission rack 21123 is arranged at a lower side of the first support body 21121 and the first bracket body 21121 is arranged at an upper side of the first support body 21121.

The first transmission rack 21123 is retained on the first track 2211 of the support base 221, and the first transmission rack 21123 has transmission teeth configured to be meshed with the linkage element 223. The first guiding element 21122 of the first screen support 2112 is retained inside a top portion of the supporting back panel 222, whereby the supporting back panel 222 guides the first screen unit 211 to move in a specific direction through the first guide element 21122.

Person in this art would understand that, in one embodiment of the present invention, the structure of the first screen unit 211 and the second screen unit 212 may be the same, or that the first screen unit 211 and the second screen unit 212 are mirror-symmetrical, wherein the first screen unit 211 and the second screen unit 212 are arranged in front and rear positions overlappedly during the retracted state and linkedly moved correspondingly through a gear transmission between the transmission racks 21123, 21242 and the linkage element 223, as shown in FIGS. 5A to 5D.

The second screen unit 212 includes a second display element 2121, a second screen support 2122, and a screen track support 2123, wherein the second display element 2121 is fixedly mounted on the second screen support 2122, the second display element 2121 is supported and protected by the second screen support 2122, and the second screen support 2122 is configured to synchronously move with the second display element 2121 integrally. It is worth mentioning that the structure and function of the second display element 2121 and the first display element 2111 are embodied the same. The second screen support 2122 is slidably disposed on the screen track support 2123 which guides the moving direction and position of the second screen support 2122.

The screen track supporting frame 2123 further includes a first track support 21231 and a second track support 21232, wherein the first track support 21231 and the second track support 21232 are configured to guide the second screen support 2122 to move in at least one predetermined direction. Preferably, the first track support 21231 is configured to be mounted above the second screen support 2122 and the second track support 21232 is configured to be mounted below the second screen support 2122 in such a manner that the second screen support 2122 is guided to move by the first track support 21231 and the second track support 21232 in combination.

The second screen unit 212 further includes a transmission device 2124 which is arranged at the second track 2212 and transmittably coupled with the linkage element 223 through gear engaging manner. Accordingly, the second screen support 2122 is drivably connected with the transmission device 2124 such that when the transmission device 2124 is driven to move, the transmission device 2124 drives the second screen support 2122 and the second display element 2121 to move synchronously.

The transmission device 2124 includes a second transmission track 21241 and a transmission connecting member 21242 integrally extending from the second transmission rack 21241, wherein the second screen support 2122 is drivably connected to a transmission connecting member 21242 of the transmission device 2124, and the second transmission rack 21241 is arranged on the second track 2212 and is meshed with the gear type linkage element 223.

The second screen support 2122 further includes a support body 21221 and at least two guide rods 21222 arranged on the support body 21221, wherein at least one of the guide rods 21222 is arranged on a back portion of the support body 2122 and protruded from an upper end or a lower end of the support body 21221. The guide rod 21222 of the second screen support 2122 is limited by the screen track support 2123 in order to guide the movement of the support body 2122 of the second screen support 2122.

Preferably, in this preferred embodiment of the present invention, the number of the guide rods of the second screen support 2122 is four or more, wherein at least two of the guide rods 21222 are provided and protruded at the upper end of the stent body 21221 and at least two guide rods 21222 are provided and protruded at the lower end of the support body 21221.

The at least two guide rods 21222 located at the upper end of the support body 21221 are limited to the first track support 21231, and the at least two guide rods 21222 located at the lower end of the support body 212221 are limited to the second track support 21232, wherein the first track support 21231 and the second track support 21232 guide the screen support 2122 to move in a specific direction through the protruding guide rod 21222.

It is worth mentioning that the guide rod 21222 at the lower end extends from the bracket main body 21221 to the transmission device 2124. Further, the guide rod 21222 can be drivingly connected with the transmission connecting member 21242 of the transmission device 2124, such that the transmission device 2124 drives the second screen support 2122 to move or, in other words, the second screen support 2122 transmits the applied force to the transmission device 2124.

The first track support 21231 has a first guide slot 212310 provided therein and the second track support 23232 has a second guide slot 232320 provided therein, wherein the first guide slot 212310 of the first track support 21231 is arranged symmetrically corresponding to the second guide slot 232320 of the second track support 23232, wherein the guide rods 21222 are retained and limited in the first guide slot and the second guide slot respectively, such that the first guide slot 21231 of the first track support 21231 and the second guide slot 232320 of the second track support 23232 guide the movement of the second screen support 2122 through the guide rods 21222.

Preferably, the first guide slot 212310 of the first track support 21231 and the second guide slot 232320 of the second track support 23232 are through slots, wherein the corresponding guide rods 21222 pass through the second guide slot 23230 and extend to the transmission device 2124.

Each of the first guide slot 212310 of the first track support 21231 and the second guide slot 232320 of the second track support 23232 includes a linear guide section 21233, a slanted guide section 21234 in inclinedly extended from an inner end of the linear guide section 21233, and a positioning hole 21235 formed between the linear guide section 21233 and the slanted guide section 21234, wherein the linear guide section 21233 and the inclined guide section 21234 communicate with each other to form the elongated first guide slot 212310 or the elongated second guide slot 232320. The positioning hole 21235 is positioned at the inner end of the linear guide section 21233, and the slanted guide section 21234 extends gradually and inclinedly towards the positioning hole 21235. Preferably, the position of the positioning hole 21235 and the position of an end point of the slanted guide section 21234 are in the same horizontal position, so that when the second screen support 2122 is guided to the slanted guide section 21234, the corresponding guide rod 21222 is guided to the position of the positioning hole 21235 ensuring the first screen unit 211 and the second screen unit 212 on the same plane.

Accordingly, when the first screen unit 211 and the second screen unit 212 of the screen display device 20 are expanded to the extended state, the display interfaces of the first screen unit 211 and the second screen unit 212 are positioned in the same plane, facilitating user's viewing and observation. Correspondingly, the slanted guide section 21234 extends inclinedly from the linear guide section 21233 towards the direction of the first screen unit 211, so that when the second screen unit 212 is guided to the slanted guide section 21234, the first screen unit 211 and the second screen unit 212 are driven to position overlappedly in the retracted state as shown in FIG. 5A. It is worth mentioning that, when the second screen unit 212 is unfolded and extended, at least one of the guide rods 21222 of the second screen support 2122 is guided to the positioning hole 21225, so that the screen support 2122 of the second screen unit 212 is locked to prevent unwanted movement.

In the first preferred embodiment of the present invention, the screen display device 20 further includes at least one position driving element 24 which is arranged between the supporting back panel 222 and the second screen unit 212, and that the second screen unit 212 is driven to move in the direction towards the first screen unit 211 through the positioning driving element 24 until the first screen unit 211 and the second screen unit 212 are positioned in the same plane.

In detail, the position driving element 24 is configured to drive the second screen support 2122 of the second screen unit 212 in such a manner that, when the guide rod 21222 is moved to a position corresponding to the positioning hole 21235, the guide rod 21222 is moved towards the positioning hole 21235 through the guide rod 21222 of the second screen support 2122 to enable the second screen unit 212 being locked in the positioning hole 21235 while the first screen unit 211 and the second screen unit 212 are in the same position.

The transmission connecting member 21242 of the transmission device 2124 further has at least one transmission connecting hole 21240 provided therein and corresponding to the guide rod. Preferably, in this preferred embodiment of the present invention, the transmission connection hole 21240 is embodied as an elongated hole to allow the guide rod 21222 to move in a length direction of the transmission connecting hole 21240. That is, when the screen assembly 21 is unfolded to extend, the second screen unit 212 can be driven by the position driving element 24 to move in a direction towards the first screen unit 211 while the first screen unit 211 and the second screen unit 212 are positioned in the same plane.

Preferably, the position driving element 24 is implemented as a magnetic element, such as a magnet. The position driving element 24 further includes a moving end driving element 241 and a fixed end during element 242, wherein the moving end driving element 241 is arranged on the back of the second screen unit 212 and the fixed-end driving element 242 is arranged on the supporting back panel 222, wherein the moving end driving element 241 and the fixed end driving element 242 are arranged opposite to each other. When the moving end driving element 241 is moved to the fixed end driving element 242, the fixed end driving element 242 drives the moving end driving element 241 to move. Preferably, the moving end driving element 241 and the fixed end driving element 242 are implemented as magnetic elements with the same magnetic poles so as to repel each other and push the second screen unit 212 from a back position behind the first screen unit 211 forward to a front position and become aligned with the first screen unit 211 on the same plane.

More preferably, the moving end driving element 241 is provided on the guide rod 21222 of the second screen support 2122 of the second screen unit 212. When the guide rod 21222 moves to the positioning hole 21235, the fixed end driving element 242 drives the second screen support 2122 of the second screen unit 212 to move through the moving end driving element 241, so that the guide rod 21222 moves in the positioning hole.

Figure 2:
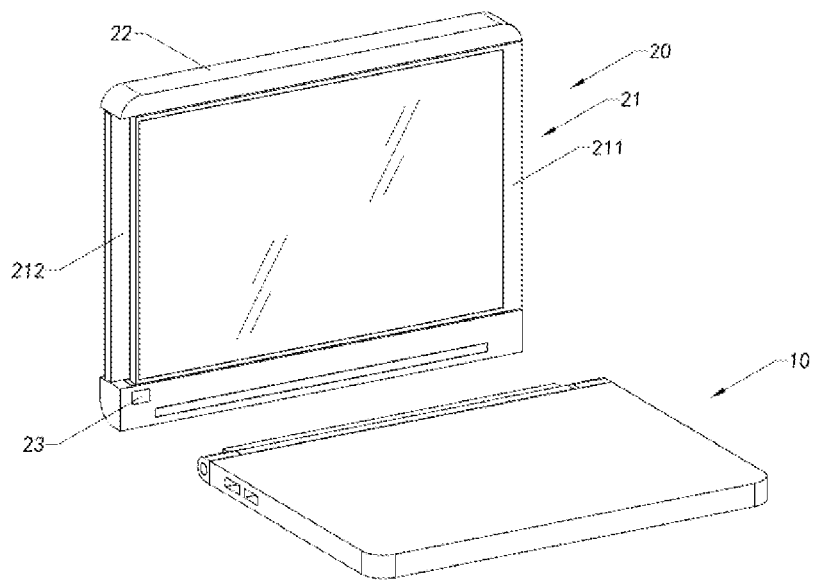
FIG. 2 is an exploded view of a screen display device and a power supply device of the extensible display screen apparatus according to the above first preferred embodiment of the present invention.

The screen display device 20 is pivotally connected to the power supply device 10 which comprises one or more chargeable batteries therein, such that the power supply device 10 is adapted to be placed on a support surface such as a table top and the screen display device 20 can be supported by the power supply device 10 to viewable position having an adjustable angle with the power supply device 10 by pivotally rotating the screen display device 20 with respect to the power supply device 10, as shown in FIG. 1. Either the screen display device 20 is expanded to its extended state or in the retracted state, the user may simply put the mobile electronic device on or near the power supply device 10 to link with the screen display device 20 and supplies power to the mobile electronic device via device terminals 101, 102 such as USB ports provided at the power supply device 10. The screen display device 20 is configured to be detachable from the power supply device 10, as shown in FIG. 2, so that the user may place and use the screen display device 20 and power supply device 10 independently at desire.

Figure 8:
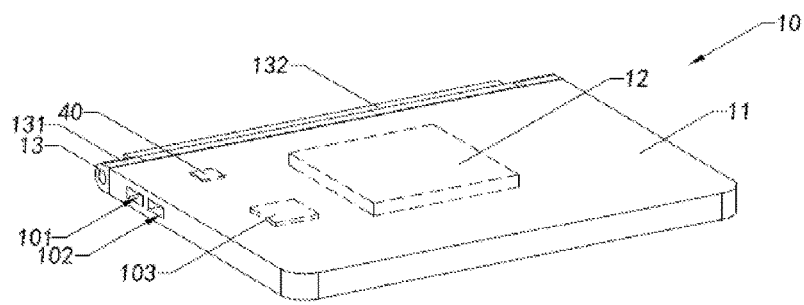
FIG. 8 is a schematic view of a power supply device of the extensible display screen apparatus according to the above first preferred embodiment of the present invention.

Referring to FIG. 8, the power supply device 10 includes a power supply housing 11, at least one power supply unit 12 such as rechargeable battery arranged in the power supply housing 11, and a supporting shaft 13, wherein the supporting shaft 13 is arranged at one side of the power supply housing 11 and the screen display device 20 can be electrically connected to the supporting shaft 13 of the power supply device 10, preferably in a detachable manner. Preferably, in this preferred embodiment of the present invention, the screen display device 20 can be electrically connected to the supporting shaft 13 by pivotally plugging with the power supply device 10. Correspondingly, the screen display device 20 is provided with a pair of connecting ports at two lower sides thereof with respect to the supporting shaft 13 in shape and size such that two end portions of the supporting shaft 13 are adapted to be pivotally inserted into the connecting ports respectively.

Preferably, in other embodiments of the present invention, the screen display device 20 may also connected to the power supply device 10 through other connection methods, such as hinge connection.

The power supply device 10 further includes one or more device ports 101, 102, which is configured to be electrically connected with the power supply unit 12 and configured for a mobile electrical device electrically connected thereto for supplying power to the external mobile electronic devices therethrough, electrically connecting with an external power supply to charge the power supply unit 12, or providing external electric power for the screen display device 20. Alternatively, according to the first preferred embodiment of the present invention, the power supply device 10 may also be configured to provide working power to the screen display device 20 from the external mobile electronic device electrically connected with one of the device ports 101, 102. In this preferred embodiment of the present invention, the one or more device ports 101, 102 of the power supply device 10 may be, but not limited to use, a USB port, a Type-C port, and etc. The power supply device 10 may further provide at least one charging port, for example the device port 102, and at least one circuit control board 103 electrically connected with the power supply unit 12 and the at least one charging port, wherein the charging port 102 communicates with the at least one power supply unit 12 of the power supply device 10 through the circuit control board 103, that is, the power supply unit 12 is charged through the charging port 102.

It is worth mentioning that, in this preferred embodiment of the present invention, the data transmission unit 23 is arranged in the screen support assembly 22, wherein the data transmission unit 23 is configured to be communicably connected to the first screen unit 211 and the second screen unit 212. When the screen assembly 21 is in the retracted state, the data transmission unit 23 is configured to communicatively connect the first screen unit 211 to the mobile electronic device, such that the display information of the mobile electronic device is able to be displayed to the first screen unit 211. When the screen assembly 21 is in the extended state, the data transmission unit 23 is configured to communicatively connect the first screen unit 211 and the second screen unit 212 to the mobile electronic device, wherein the display information of the mobile electronic device is provided to the first screen unit 211 and the second screen unit 212 through the data transmission unit 23, that is the first screen unit 211 and the second screen unit 212 provide display interfaces required by mobile electronic devices at the same time.

The power supply unit 12 of the power supply device 10 can be used to store electrical energy and the supporting shaft 13 is configured to enable the power supply device 10 to provide the stored electrical energy to the screen display device 20 so as to support the operation of the screen display device. Referring to FIG. 8, the supporting shaft 13 includes a shaft body 131 and an electrical connection element 132 disposed on the shaft body 131, wherein the shaft body 131 is pivotally arranged on the power supply housing 11, and the electrical connection element 132 is fixedly supported on the shaft 131 and electrically connected to the at least one power supply unit 12. The electrical connection element 132 can be connected to the interface of the screen display device 20, so that the power supply unit 12 can transmits the stored electric energy to the screen display device 20 through the electrical connection element 132.

It is worth mentioning that, in this preferred embodiment of the present invention, the electrical connection element 132 is fixedly arranged on the shaft 131 such that the electrical connection element 132 is able to be rotated with the shaft 131. Also, the screen display device 20 can be coupled with the power supply device 10 as a whole and be unfolded to pivotally open the screen display device 20 upwards from the power supply device 10 for viewing or folded to pivotally shut the screen display device 20 downward to overlap on the power supply device 10, especially when the extensible display screen apparatus is not in use, by pivotally adjusting through the shaft 131, that is conducive to saving space and facilitating storage.

Accordingly, by adjusting a rotation angle of the shaft 131 to adjust the overall rotation direction and rotation angle of the screen display device 20 in order to adjust the orientation and position of the at least one screen assembly 21 of the screen display device 20.

Figure 9:
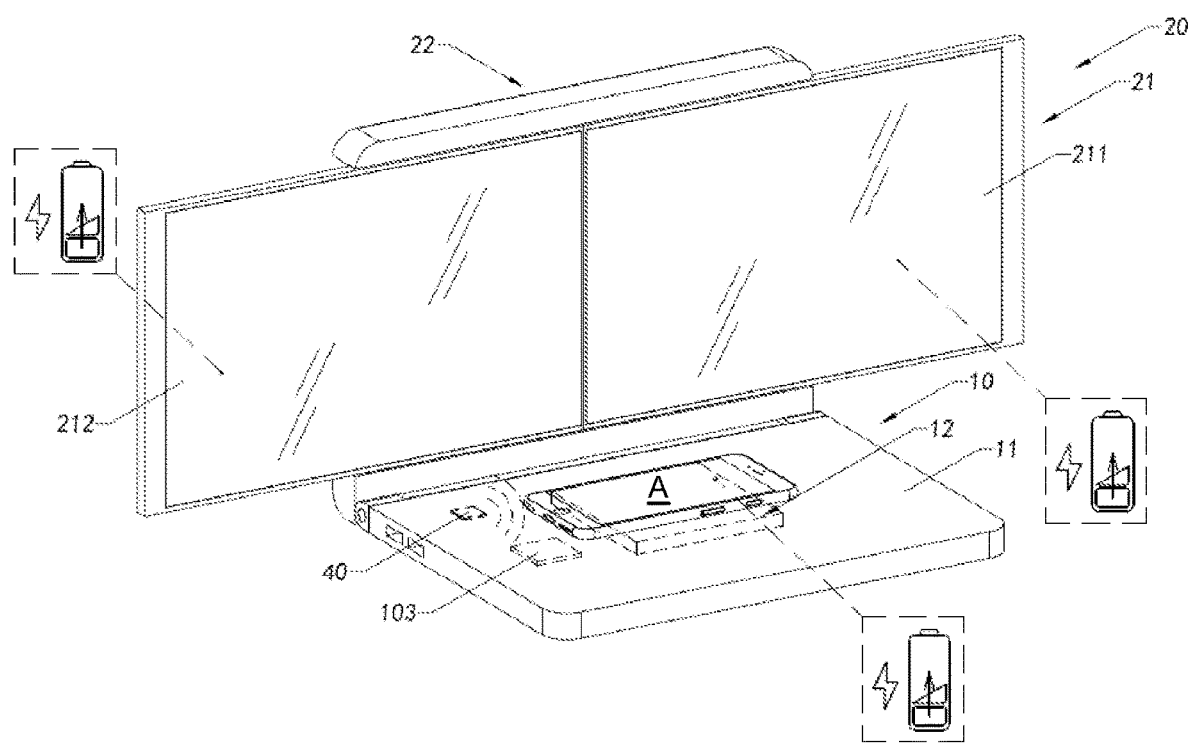
FIG. 9 is a schematic view illustrating the extensible display screen apparatus paired with a mobile electronic device according to the above first preferred embodiment of the present invention.

Referring to FIG. 9, the extensible display screen apparatus further includes a device docking component 40, which is communicatively connected to the screen display device 20, wherein the mobile electronic device, such as a mobile smart phone A, and the screen display device 20 are paired through the device docking element 40, so that the mobile electronic device A transmits display the information to the screen display device 20. Preferably, the docking device component 40 may be implemented as an NFC component, so that when the mobile electronic device A is close to the docking device component 40, the mobile electronic device A is paired with the screen display device 20. On the other hand, the docking device element 40 is provided in the power supply device 10, that is, when a mobile electronic device is placed on the power supply device 10 and when approaching to the docking device element 40, the mobile electronic device is paired and connected with the screen display device 20 through the docking device component 40.

Figure 6A:
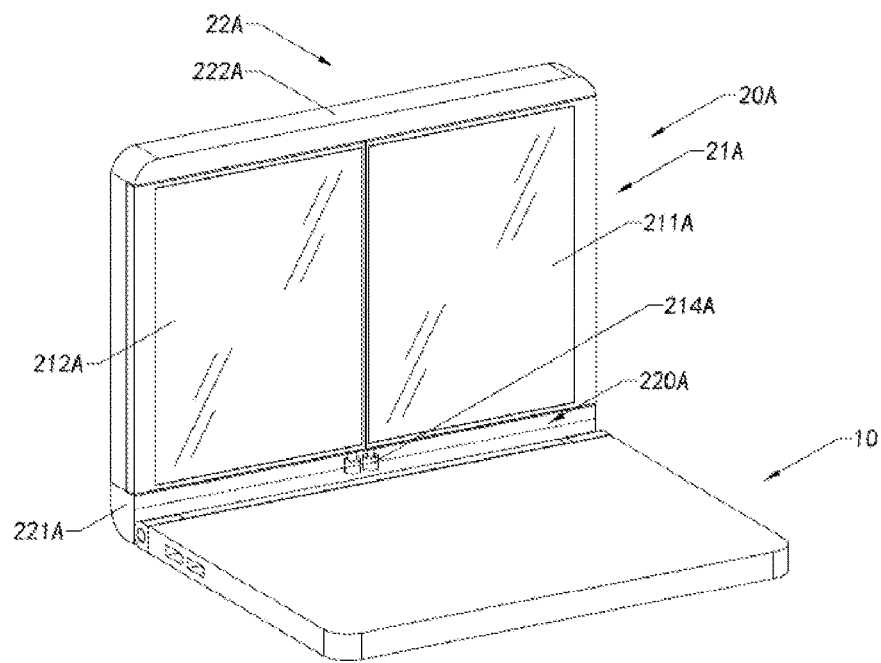
FIG. 6A to 6C are schematic views illustrating a first alternative mode of the screen display device, including first and second screen units, of the extensible display screen apparatus according to the above first preferred embodiment of the present invention.
Figure 6B:
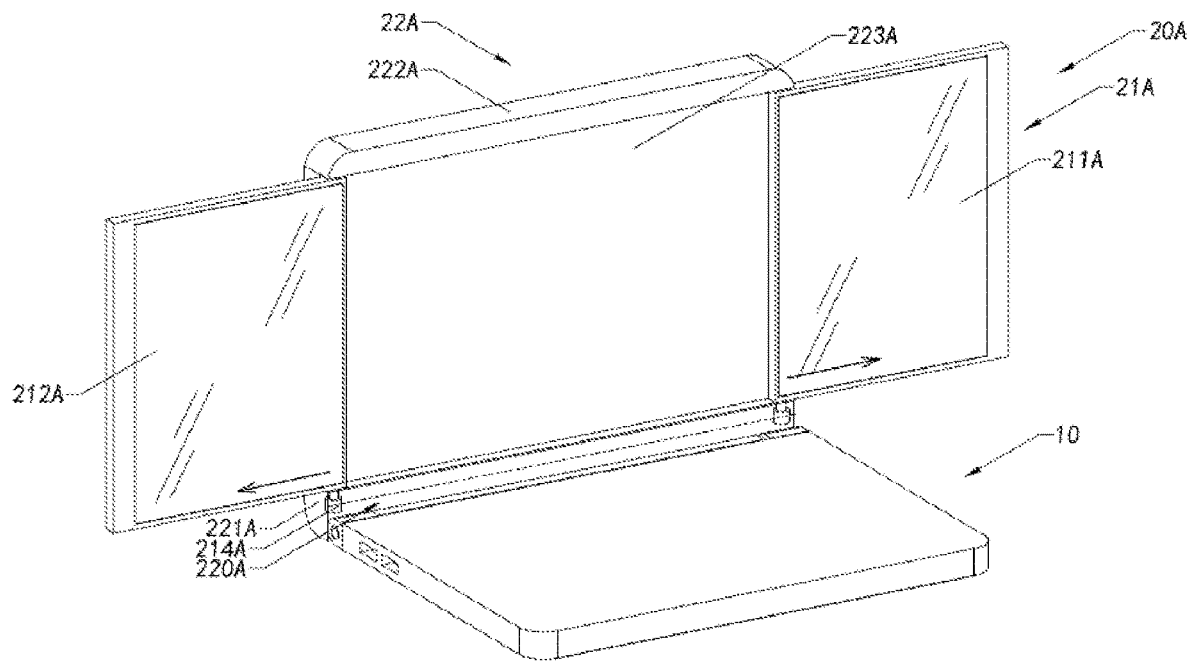
Figure 6C:
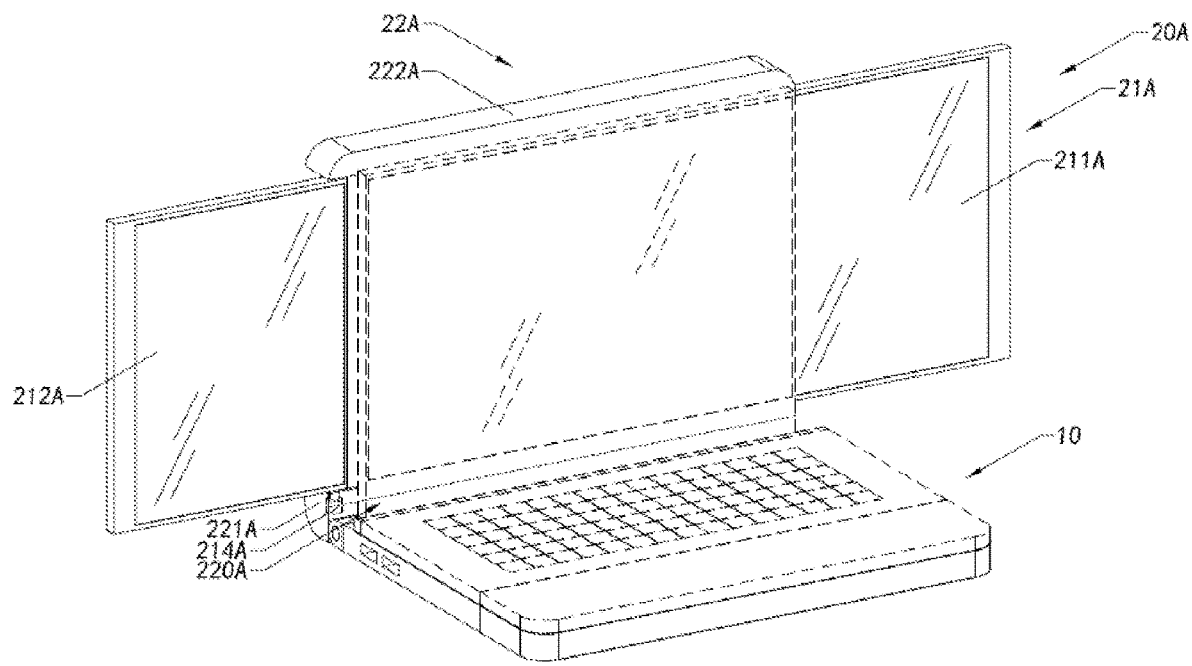

Referring to FIGS. 6A to 6C, according to another aspect of the present invention, a first alternative mode of the screen display device 20 of the extensible display screen apparatus for a mobile electronic device according to the first preferred embodiment of the present invention is illustrated and described hereinafter. The screen display device 20 includes at least one screen assembly 21A and a screen support assembly 22A configured to mount and support the at least one screen assembly 21A in position. In other words, the at least one screen assembly 21A is disposed on and supported by the screen support assembly 22A. In this alternative mode of the first preferred embodiment of the present invention, the number of the screen assembly 21A can be two, three or more.

The screen assembly 21A is extensibly arranged on the screen support assembly 22A, as shown in FIG. 6A, wherein the difference between this alternative mode and the above-mentioned first preferred embodiment is that the screen assembly 21A extends outward from the outer side of the screen support assembly 22A in the extended state, as shown in FIG. 6B. As an example, the screen assembly 21A includes a first screen unit 211A and a second screen unit 212A, wherein the first screen unit 211A and the second screen unit 212A have a symmetrical structure.

The screen support assembly 22A has an accommodation space. In addition, the screen support assembly 22A further has a sliding slot 220A provided therein, wherein the screen assembly 21A is slidably coupled with the sliding slot 220A of the screen support assembly 22A in such a manner that the screen assembly 21A is allowed to slidably move left and right along the sliding slot 220A.

Referring to FIGS. 6A and 6B, the screen support assembly 22A includes a base portion 221A, a top portion 222A, and a back panel 223A fixedly connected the base portion 221A with the top portion 222A, wherein the accommodation space is defined between the base portion 221A and the top portion 222A and the base portion 221A, the top portion 222A and the back panel 223A of the screen support assembly 22A are configured to form the sliding slot 220A.

In this alternative mode of the first preferred embodiment of the present invention, the first screen unit 211A and the second screen unit 212A of the screen assembly 21A are arranged side by side in the sliding slot 220A of the screen support assembly 22A that the sliding slot 220A allows the first screen unit 212A to slide to both sides of the sliding slot 220A so as to extend the screen assembly 21A outwardly to the extended state or retract the screen assembly 21A inwardly to the retracted state.

When the screen assembly 21A is in the extended state, as shown in FIG. 6B, the first screen unit 211A is moved to the left side of the sliding slot 220A and the second screen unit 212A is moved to the right side of the sliding slot 220A, wherein a receiving space is formed between the extended first and second screen units 211A, 212A, allowing the mobile electronic devices to be placed in the receiving space between the first screen unit 211A and the second screen unit 212A.

Referring to FIG. 6C, it is appreciated that for the extensible display screen apparatus in the extended state is especially adapted to be used with a tablet or a notebook computer, wherein a notebook B can be placed on the power supply device 10A while the power supply device 10A may also supply power for the notebook B through electrically connecting the notebook B to one of the device ports 101, 102 of the power supply device 10A. When the screen of the notebook B is unfolded to rotate upwards, the screen B1 of the notebook B may just be positioned between the first screen unit 211A and the second screen unit 212A of the screen display device 20A. In other words, the first screen unit 211A and the second screen unit 212A form two extended viewable screens in addition to the original screen B1 of the notebook B. The display information from the notebook B can be transmitted to the screen assembly 21A, and it can be an additional display interface provided by the screen assembly 21A. Correspondingly, in this alternative mode of the first preferred embodiment of the present invention, the extensible display screen apparatus provides an additional display screen interface for the notebook B.

Further, the screen assembly 21A includes a screen body 213A and at least one sliding element 214A arranged in the screen body 213A, wherein the sliding element 214A is arranged at the upper end and/or the lower end of the screen body 213A for supporting the screen body 213A to move along the sliding slot 220A through the sliding element 214A. The sliding element 214A of the screen assembly 21A is slidably retained to the sliding slot 220A of the screen support assembly 20A.

Figure 7:
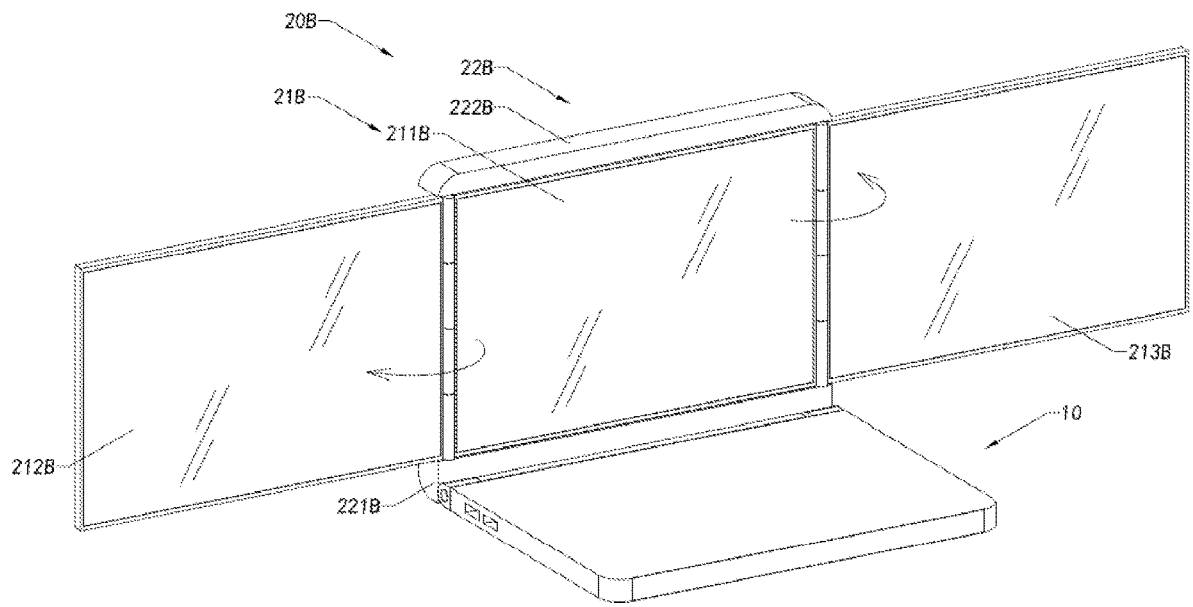
FIG. 7 is a schematic view of a second alternative mode of the extensible display screen apparatus according to the above first preferred embodiment of the present invention, wherein the screen display device includes a third screen unit.

Referring to FIG. 7, a second alternative mode of the screen display device of the extensible display screen apparatus for mobile electronic device according to the first preferred embodiment of the present invention is illustrated and described hereinafter. The difference between this second alternative mode and the first preferred embodiment is the screen display device 20B. In the second alternative mode, the screen display device 20B includes a screen assembly 21B which comprises two or more screen units 211B, 212B, 213B and a screen support assembly 22B supporting the screen assembly 21B. The screen assembly 21B is arranged on the screen support assembly 22B and is configured to be capable of electrically connecting with a power supply device 10B through the screen support assembly 22B.

As an example, according to the second alternative mode of the first preferred embodiment of the present invention, the screen assembly 21B includes three screen units, namely a first screen unit 211B, a second screen unit 212B coupled to the first screen unit 211B, and a third screen assembly 215B coupled to the first screen unit 211B, wherein the second screen unit 212B and the third screen assembly 215B are arranged on two sides of the first screen unit 211B respectively, and the second screen unit 212B and the third screen assembly 215B are pivotally connected to two opposing sides the first screen unit 211B respectively such that the second screen unit 212B and the third screen assembly 213B can able to pivotally rotate to extend outwardly from the two sides of the first screen unit 211B under the support of the first screen unit 211B.

It is worth mentioning that, according to the second alternative mode of the first preferred embodiment of the present invention, the first screen unit 211B of the screen assembly 21B is mounted on the screen support assembly 22B, and the second screen unit 212B and the third screen assembly 215B are pivotally hinged to left and right sides of the first screen unit 211B and arranged to be folded on the first screen unit 211B one by one in a retracted state that the second screen unit 212B and the third screen assembly 215B are stacked on the first screen unit 211B overlappedly. Correspondingly, when the screen assembly 21B is in an extended state, the second and third screen units 212B, 213B can be pivotally unfolded one by one to be extended from the left and right sides of the first screen unit 211B with an adjustable angle between the first screen unit 211B and the second screen unit 212B or the third screen unit 213B so as provide extended viewable area of the screen assembly 21B.

Alternatively, according to the second alternative mode of the first preferred embodiment of the present invention, the folding directions of the second screen unit 212B and the third screen assembly 215B can be the same or opposite to each other, that is, the second screen unit 212B and the third screen assembly 215B can be folded on the same side of the first screen unit 211B, or the second screen unit 212B and the third screen assembly 215B are located on opposite sides of the first screen unit 211B.

Each of the screen units 211B, 212B, 213B of the screen assembly 21B has a display surface and a back surface opposite to the display surface, wherein when the screen assembly 21B is in the retracted state (folded state), the display surfaces of the second screen unit 212B and the third screen assembly 215B face the display surface of the first screen unit 211B.

The screen assembly 21B further includes at least two pivotal connection members 214B provided at left and right sides thereof, wherein the pivotal connection members 214B are configured to pivotally connect the second screen unit 212B of the screen assembly 21B to the left side of the first screen unit 211B and pivotally connect the third screen unit 213B to the right side of the first screen unit 211B.

Preferably, in this second alternative mode of the first preferred embodiment of the present invention, the pivotal connection members 214B are implemented as hinge members.

Figure 10A:
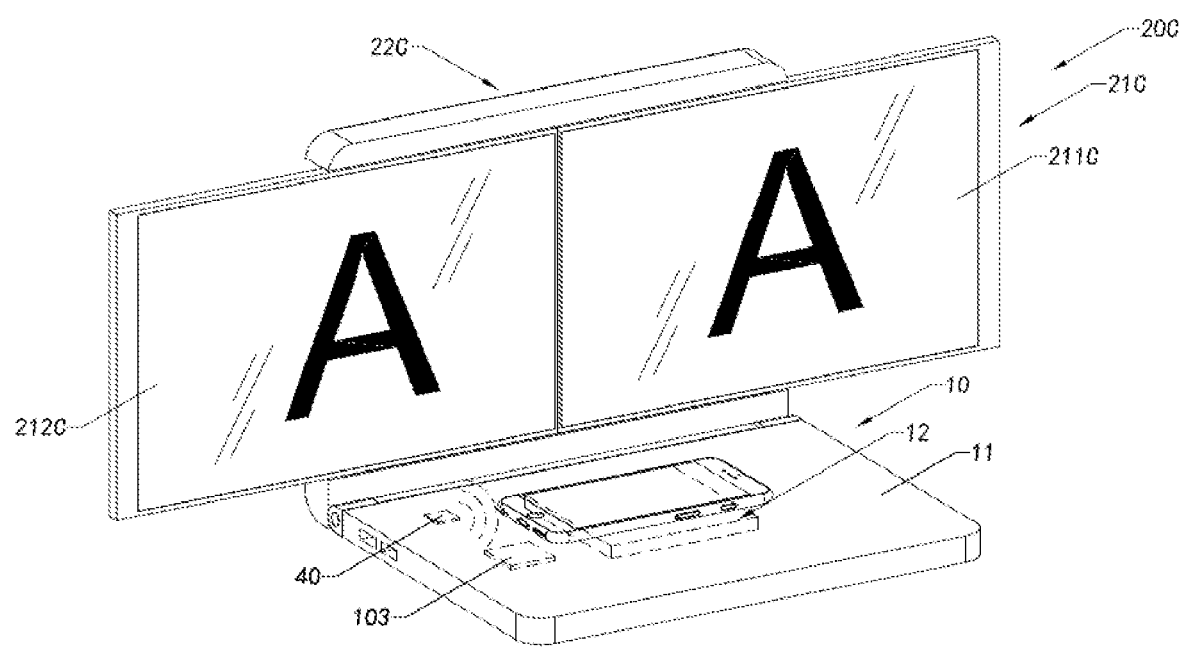
FIGS. 10A and 10B are schematic view illustrating the working states of the extensible display screen apparatus according to the above first preferred embodiment of the present invention, wherein the extensible display screen apparatus is illustrated as a combined display screen in use.
Figure 10B:
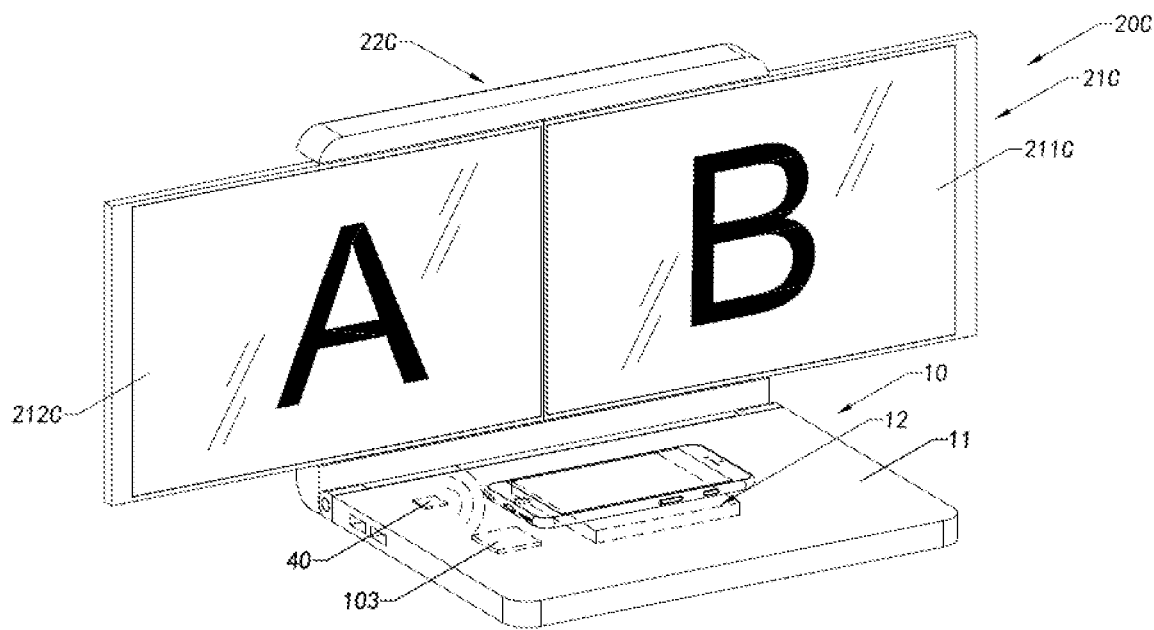
Figure 11:
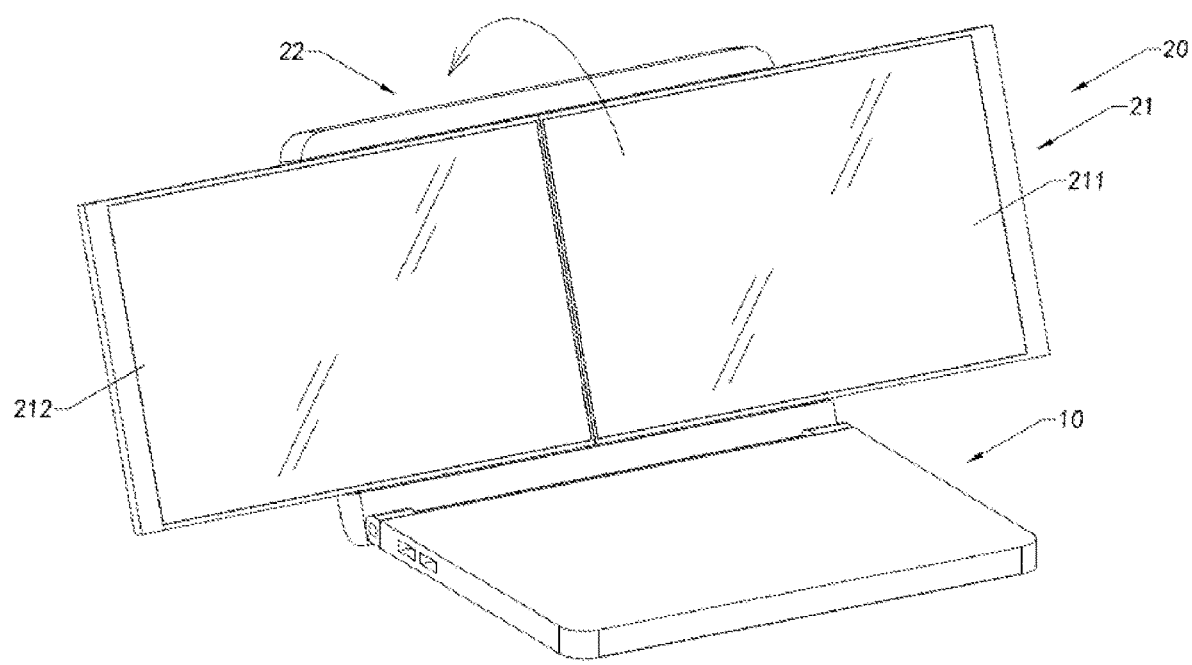
FIG. 11 is a schematic view illustrating the adjustment of the extensible display screen apparatus according to the above first preferred embodiment of the present invention.
Figure 12:
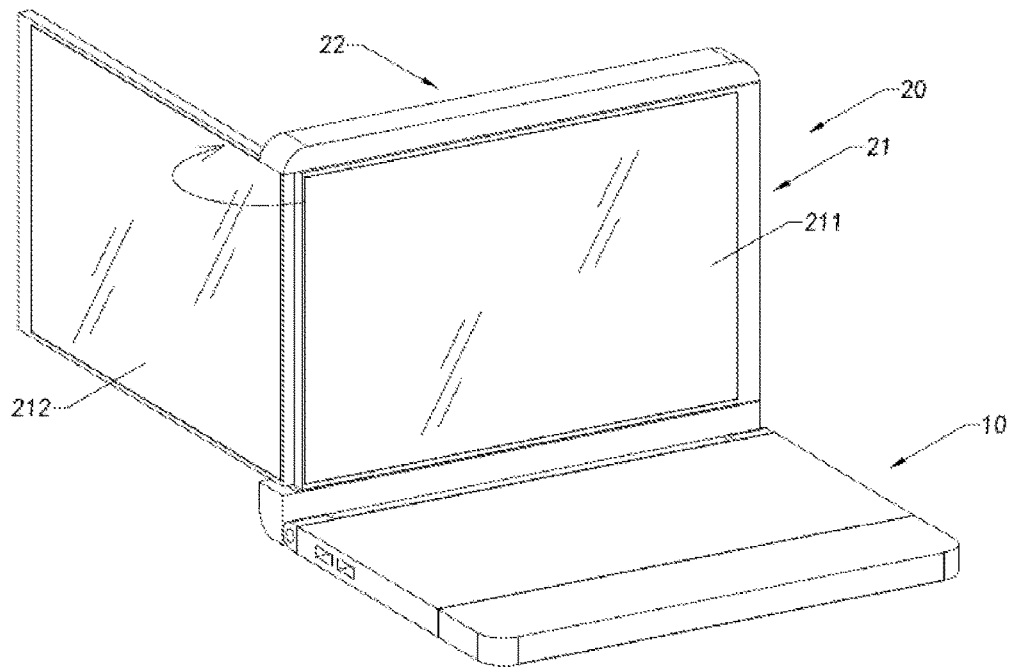
FIG. 12 is another schematic view illustrating the adjustment of the extensible display screen apparatus according to the above first preferred embodiment of the present invention.

Referring to FIGS. 10A to 10B, two different ways of using the extensible display screen apparatus of the present invention are illustrated, wherein when the screen assembly 21C is in the extended state, the screen units 21C of the extensible display screen apparatus is expanded to side by side manner, and the display interface of the mobile electronic device A paired is expanded based on the received display information. A display mode of the extensible display screen apparatus provides an independent display interface for each of the screen units 21C to be setup. In short, according to the preferred embodiment of the present invention, each of the screen units 21C respectively provides a corresponding display interface "A" and "B" based on the display information of the mobile electronic device A. As an example, the first screen unit 211C and the second screen unit 212C of the screen assembly 21C display the same information "A", "A" as shown in FIG. 10A and provide different display interface. Therefore, it can be understood that the extensible display screen apparatus may provide two or more different display interfaces for the mobile electronic device A through different screen units 21C.

As shown in FIG. 10B, another different display mode is that each of the screen units 21C is set to be spliced into a combined display interface, that is, the display information of the mobile electronic device A is partially provided to the screen assembly 21C. As an example, the first screen unit 211C and the second screen unit 212C of the screen assembly 21C are combined into a parallel combined display screen, wherein the display interfaces of the first screen unit 211C and the second screen unit 212C are arranged parallel to each other into a whole display interface and extended viewing surface. The first and second screen units 211C, 212C of the screen assembly 21C may display different information "A", "B" as shown in FIG. 10B. Accordingly, the extensible display screen apparatus provides a larger display interface for the mobile electronic device.

Figure 13:
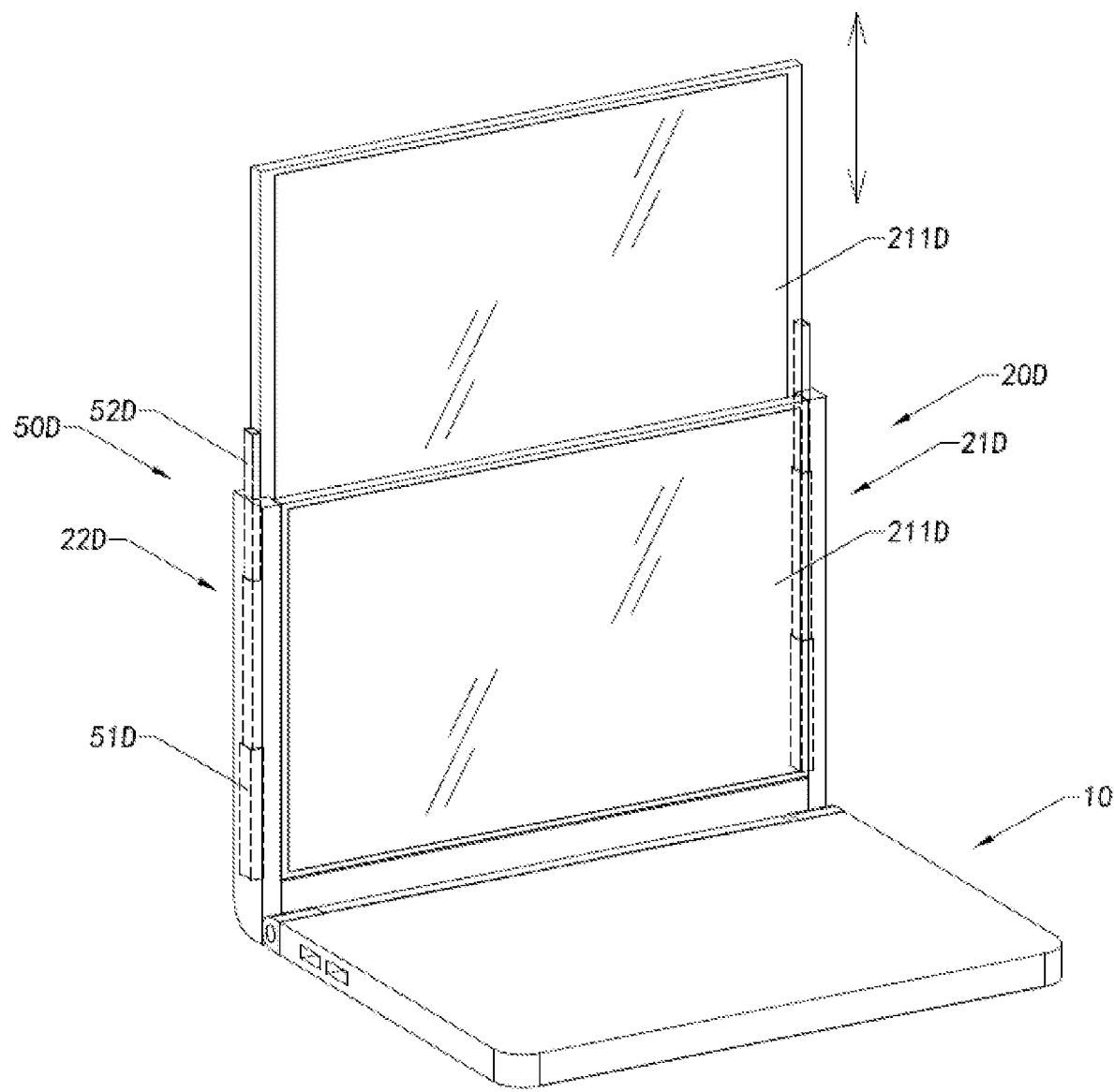
FIG. 13 is a schematic view of the extensible screen apparatus according to a second preferred embodiment of the present invention, wherein the screen unit of a screen display device of the extensible display screen can be extended and retracted up and down.

Referring to FIG. 13, a second preferred embodiment of the extensible display screen apparatus according to the present invention is illustrated. The difference between this second preferred embodiment with above described first preferred embodiment is that, the screen assembly 21D further includes at least one extensible frame 50D, wherein a lower end of the extensible frame 50D is pivotally connected to a rear side of the power supply device 10D and an upper end of the extensible frame 50D is configured extensible with respect to the power supply device 10D, wherein the screen display device 20D is arranged and supported by the extensible frame 50D, such that a height of the screen display device 20D is adjustable through operation of the extensible frame 50D.

In particular, the extensible frame 50D includes at least one rotating shaft connecting member 51D and at least one extension bar 52D, wherein the rotating shaft connecting member 51D is arranged on the power supply housing 11D of the power supply device 10D, and the extension bar 52D is pivotally arranged at the end of the shaft connecting member 51D. The screen display device 20D is pivotally mounted to the extension bar 52D, such that the height of the screen display device 20D is adjustable by adjusting an extension length of the extension bar 52D. In other alternative modes of the second preferred embodiment of the present invention, the screen display device 20D can be slidably mounted to the extension bar 52D and the screen display device 20D is supported by the extension bar 52D. Furthermore, the extension bar 52D is adapted to help adjusting a relative position and the height of the screen display device 20D.

Figure 14:
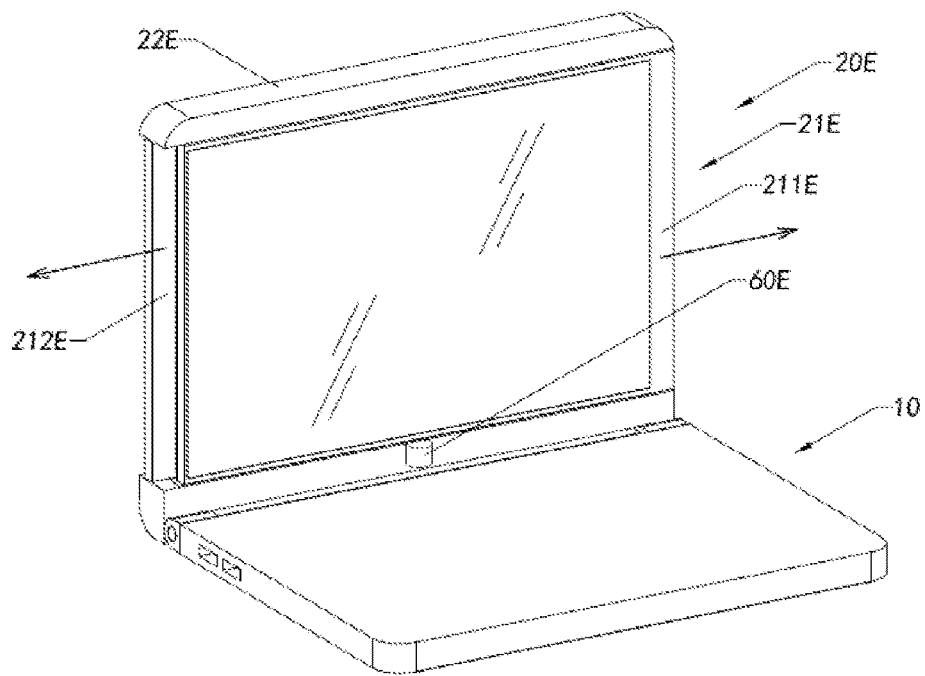
FIG. 14 is a schematic view of another alternative mode of the extensible screen apparatus according to the above preferred embodiments of the present invention, wherein the screen unit is driven to move by the electric driver.

Referring to FIG. 14, another alternative mode of the extensible display screen apparatus according to the preferred embodiments of the present invention is illustrated, wherein the extensible display screen apparatus further includes an electric driver 60E. The electric driver 60E is electrically connected to the power supply device 10E, wherein the power supply device 10 provides working power to the electric driver 60E. The electric driver 60E is drivingly connected to the screen display device 20E, and the screen display device 20E is driven to move by the electric driver 60E. Preferably, the electric drive 60E is implemented as an electric motor, wherein the electric drive 60E is fixedly arranged in the housing of the power supply device 10E, and the electric driver 60E is connected to the screen display device 20E through a gear transmission, a belt transmission or other transmission methods.

As an example, the electric driver 60E is connected to the screen display device 20E by means of gear transmission, and the electric driver 60E drives the first screen unit 211E and/or the second screen unit 212E of the screen display device 20E to move in a specific direction, for example left-and-right or up-and-down, in order to realize the extending and retracting of the screen assembly 21E.

Referring to FIGS. 15A to 15D, alternative modes of the extensible display screen apparatus according to the above-mentioned first preferred embodiment of the present invention are illustrated, wherein the screen display device 20F of the extensible display screen apparatus includes at least one screen assembly 21F and at least one screen support assembly 22F, wherein the screen support assembly 22F and the screen assembly 21F are electrically connected to the power supply device 10F and the screen assembly 21F is supported by the screen support assembly 22F. As an example, the screen assembly 21F includes a first screen unit 211F and a second screen unit 212F, wherein the first screen unit 211F and the second screen unit 212F can be electrically connected to the power supply device 10F through the screen support assembly 22F.

The screen assembly 21F further includes at least one pivotal connection member 214F arranged on at least one side of the screen assembly 21F, wherein the pivotal connection member 214F is used to pivotally connect the first screen unit 211F of the screen assembly 21F to the second screen unit 212F. The pivot connection member 214F pivotally connects the first screen unit 211F and the second screen unit 212F, allowing the second screen unit 212F to rotate about the pivotal connection member 214F to unfold and extend from the first screen unit 211F to the extended state or to fold toward and overlap with the first screen unit 211F to the retracted state. According to the alternative modes of the above mentioned preferred embodiments of the present invention, the first screen unit 211F and the second screen unit 212F are able to be extended until they are positioned in the same plane. That is, the first screen unit 211F and the second screen unit 212F unfold and extend outwards either in a horizontal direction or a vertical direction about the pivot connection 214F.

Figure 15A:
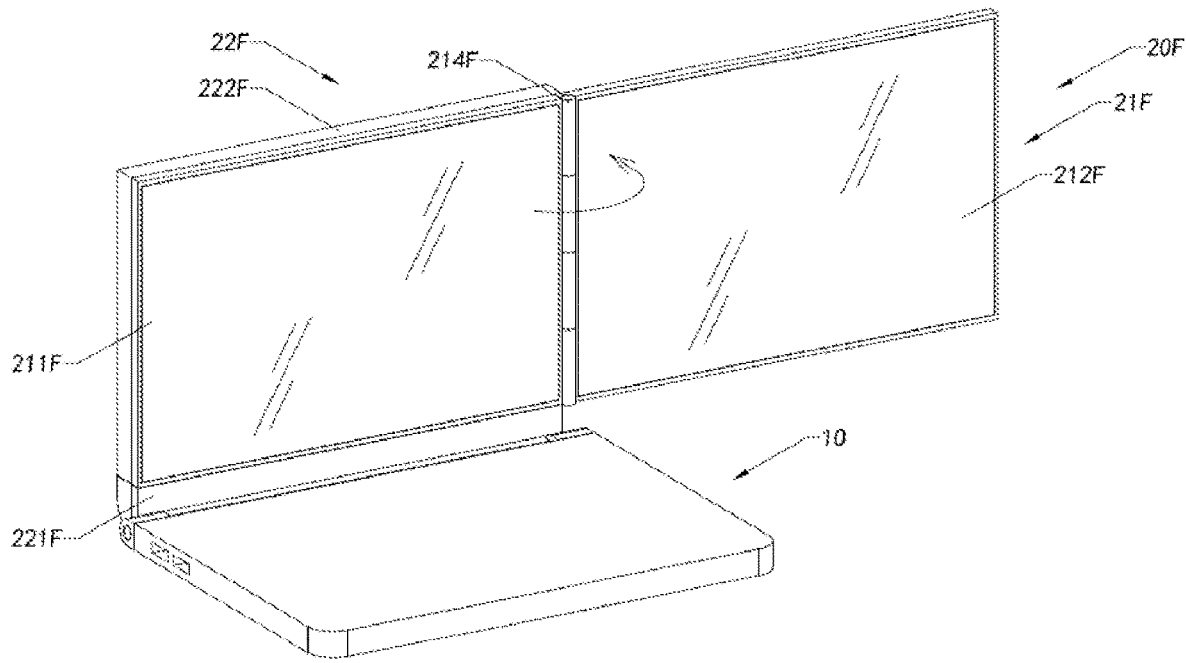
FIGS. 15A to 15D are schematic views of the extensible display screen apparatus according to other alternative modes of the first preferred embodiment of the present invention, wherein each of the screen units of the screen display device is connected by hinge mechanism.
Figure 15B:
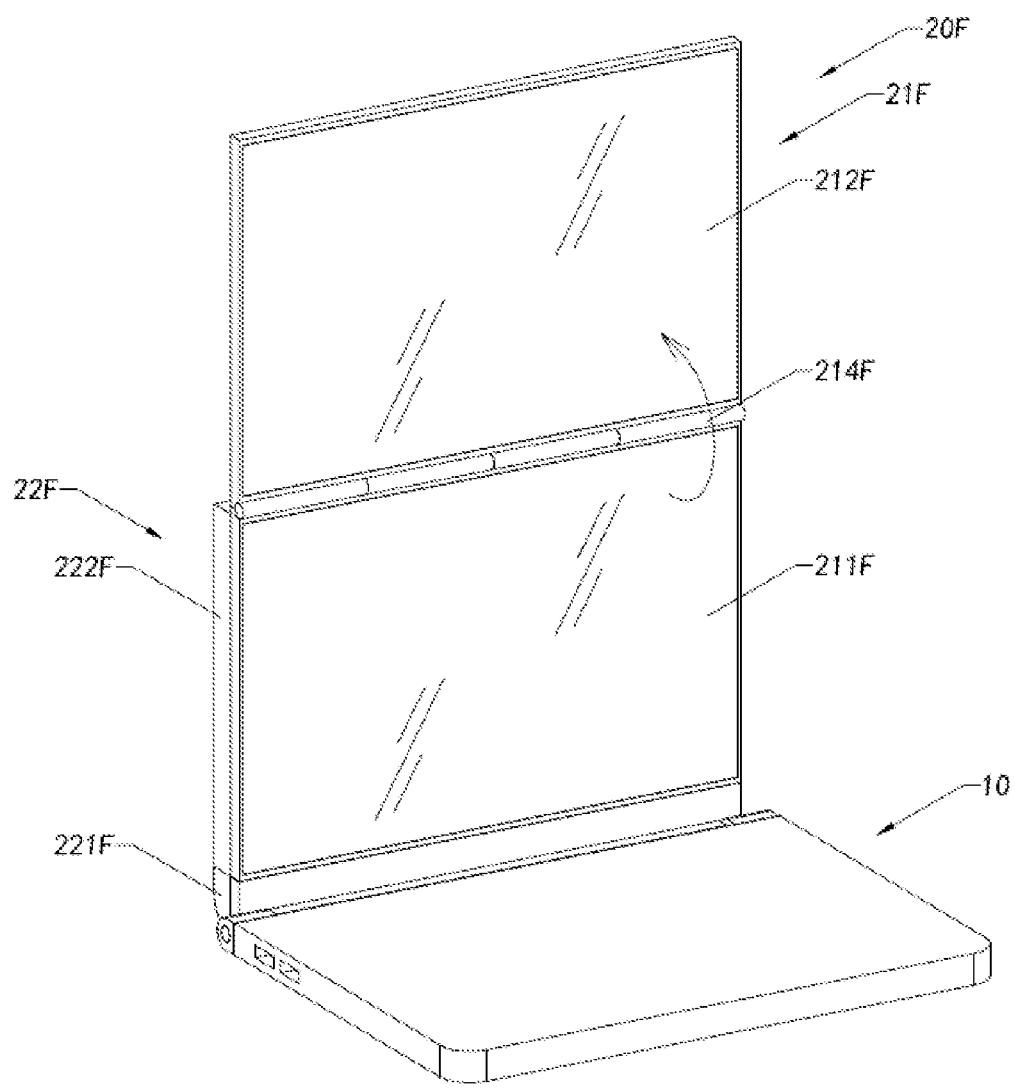

As shown in FIG. 15A, an alternative mode of the above first preferred embodiment of the present invention is illustrated, wherein the pivot connection member 214F is arranged at either a left side or a right side of the first screen unit 211F and the second screen unit 212F is pivotally connected to the left side or the right side of the first screen unit 211F through the pivot connection member 214F such that the second screen unit 212F is able to rotate about the pivot connection member 214F such that the second screen unit 212F is able to unfold and extend sidewardly to the left or the right of the first screen unit 211F. As shown in FIG. 15B, another alternative mode of the above first preferred embodiment of the present invention is illustrated, wherein the pivot connection member 214F is arranged at a top side of the first screen unit 211F and the second screen unit 212F is pivotally connected to the top side of the first screen unit 211F through the pivot connection member 214F, such that the second screen unit 212F is able to unfold and extend upwardly on top of the first screen unit 211F. In these alternative modes of the preferred embodiment of the present invention, the pivotal connection 214F is implemented as a hinge mechanism pivotally connecting the first screen unit 211F with the second screen unit 212F. In addition, the pivot connection member 214F supports the first screen unit 211F and/or the second screen unit 212F to rotate relatively thereabout in order to adjust the orientation and relative extension angle between the first and second screen units 211F, 212F.

It is worth mentioning that the first screen unit 211F of the screen assembly 21F is fixedly mounted on the screen support assembly 22F and supports the second screen unit 212F by pivotally connecting the second screen unit 212F to a side of the first screen unit 211F through the pivot connection member 214F. The screen support assembly 22F includes a support base 221F and a support back frame 222F, wherein the support back frame 222F is affixed to an upper end of the supporting base 221F and the screen assembly 21F is mounted on the supporting back panel 222F in such a manner that the screen assembly 21F is electrically connected to the power supply device 10F through the supporting base 221F.

Further, the screen support assembly 22F is provided with wires or electrical connection ports that the screen assembly 21F is able to be electrically connected to the power supply device 10F through the wire or the electrical connection ports.

The alternative modes as shown in FIGS. 15A and 15B is different from the above-mentioned first preferred embodiment in that the support back frame 222F of the screen support assembly 22F is implemented as a panel support, wherein the first screen unit 211F of the screen assembly 21F is mounted on one side of the support back frame 222F. The second screen unit 212F has a retracted state (in folded position) and an extended state (in unfolded position), wherein when the second screen unit 212F is rotated towards the first screen unit 211F to the folded position, the second screen unit 212F is opposing and overlapped in front of the first screen unit 211F while the display surfaces of the first and screen units 211F, 212F are facing with each other, and that when the second screen unit 212F is rotated to the unfolded position, the second screen unit 212F is extended sidewards or upwards and supported by the first screen unit 211F where the display surfaces of the first and second screen units 211F, 211F are preferred to facing frontward in the same plane to form a combined display screen structure for the user to view from the front.

It is worth mentioning that, according to the preferred embodiment of the present invention, the length and width of the screen assembly 21F are embodied not greater than the length and width of the supporting back panel 222F. The first screen unit 211F and the second screen unit 212F have a symmetrical structure, and the first screen unit 211F and the second screen unit 212F can be folded until the light emitting surfaces of the first screen unit 211F and the second screen unit 212F are facing each other to save storage space and protect the screen display.

It is understandable that the screen support assembly 22F is foldably coupled with the power supply device 10F, wherein after the screen assembly 21F is folded up on the support back frame 222F, by adjusting the position of the screen support assembly 22F, such as folding on top of the power supply device 10F, the screen display device 20F is able to be integrally stacked and covering on the upper surface of the power supply device 10F, thereby it is convenient to store and protecting the screen assembly 21F of the extensible display screen apparatus when it is not in use.

Figure 15C:
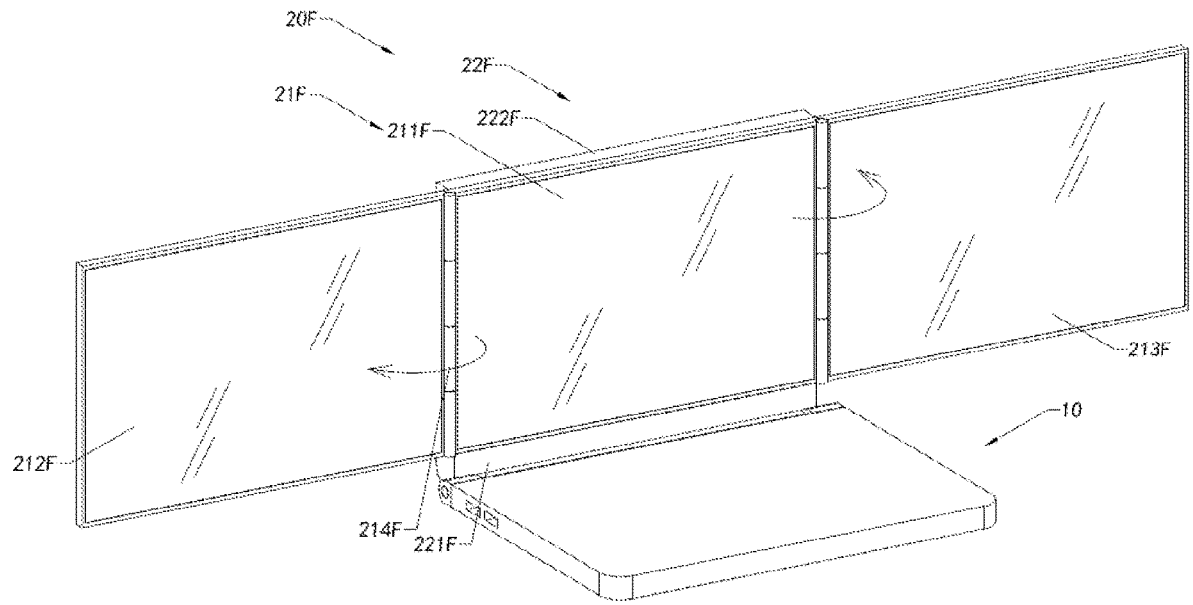

As shown in FIG. 15C, another alternative mode of the above first preferred embodiment of the present invention is illustrated, wherein the screen assembly 21F further includes a third screen unit 213F. In particular, the number of the screen units 21F in the present invention is three, wherein the second screen unit 212F and the third screen unit 213F are pivotally arranged at both sides of the first screen unit 211F through a pair of pivot connection members 214F respectively.

The second screen unit 212F and the third screen assembly 215F can be rotated and folded on the upper surface of the first screen unit 211F. Same as the above-mentioned preferred embodiments, the first screen unit 211F is fixed to the support back frame 222F of the screen support assembly 22F, wherein the first screen unit 211F, the second screen unit 212F, and the third screen assembly 215F are electrically connected to the power supply device 10F through the support base 221F. It can be understood that, in other embodiments of the present invention, the number of the screen units 21F can also be four, five or more, wherein the screen assembly 21F can be electrically connected and folded to each other like the above preferred embodiments and alternative modes thereof that are not repeated here.

Figure 15D:
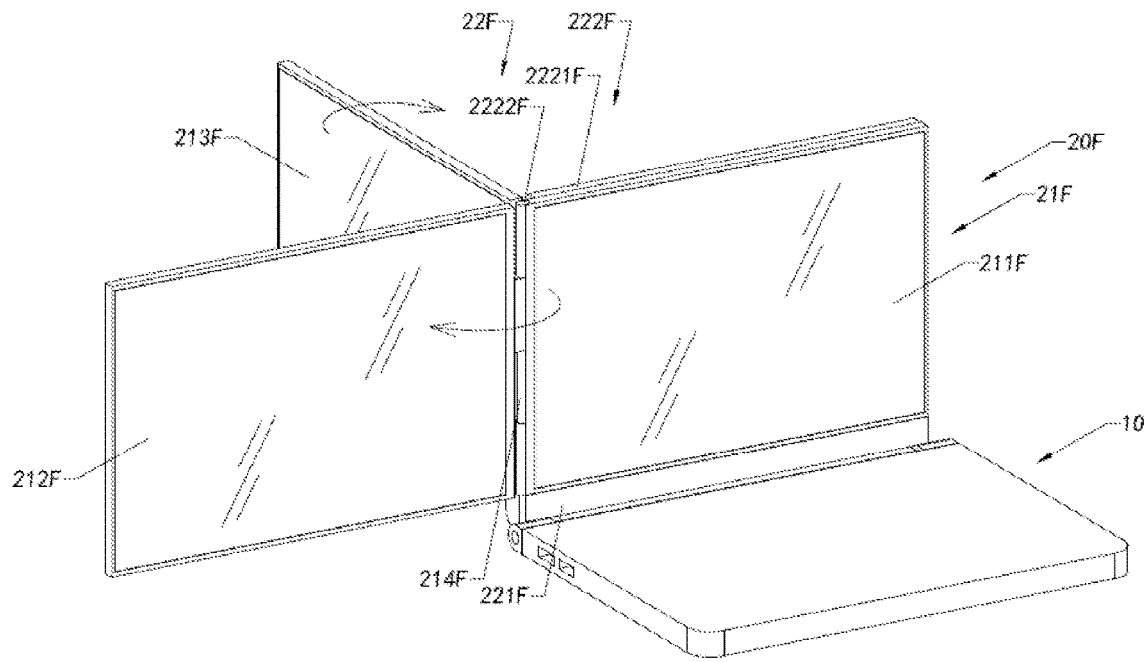

Referring to FIG. 15D, another alternative mode of the above first preferred embodiment of the present invention is illustrated, wherein the number of the screen units of the screen assembly 21F of the screen display device 20F is three or more. Each of the screen units 211F, 212F, 213F is pivotally connected to the screen support assembly 22F. As an example, each of the screen units 21F is pivotally connected to the screen support assembly 22F with the same side thereof, such as the left side, the right side or the upper side. In particular, the screen assembly 21F includes a first screen unit 211F, a second screen unit 212F, a third screen assembly 215F, and at least one pivot connection member 214F, wherein the first screen unit 211F, the second screen unit 212F and the third screen assembly 215F are pivotally connected to a support back frame 222F of the screen support assembly 22F through the pivot connection member 214F. In other words, the screen assembly 21F is pivotally connected and supported by the pivotal connection member 214F in such a manner that each of the first, second and third screen units 211F, 212F, 213F is allowed to rotate based on the pivotal connection 214F so as to adjust the direction and orientational position of each of the screen units 211F, 212F, 213F.

The support back frame 222F further includes a back frame main body 2221F and a pivotal support shaft 2222F arranged on one side of the back frame main body 2221F. The pivot connection member 214F is pivotally connected to the pivot support shaft 2222F of the support back frame 222F, which allows the first, second and third screen units 211F, 212F, 213F of the screen assembly 21F to rotate about the pivotal support shaft 2222F of the support back frame 222F with respect to the back frame main body 2221F.

According to this alternative mode as shown in FIG. 15D, the first screen unit 211F, the second screen unit 212F and the third screen assembly 215F can move circumferentially around the pivot support shaft 2222F under the support of the pivot connection member 214F, so as to adjust the orientation and position of each of the first, second and third screen units 211F, 212F, 213F. The screen display device 20F has a retracted state (folded position) and an extended state (at least one unfolded position), wherein when the screen display device 20F is in the retracted state (folded position), each of the first, second and third screen units 211F, 212F, 213F is rotated and folded to overlap with the support back frame 222F, and the display surface of each of the first, second and third screen units 211F, 212F, 213F are facing the support back frame 222F, and that when the screen display device 20F is in the extended state (unfolded position), each of the first, second and third screen units 211F, 212F, 213F rotates outwards from the support back frame 222F for a predetermined angle therebetween while it is supported and held through the pivot connection member 214F.

It is understandable that, according to this alternative mode of the preferred embodiment of the present invention, the screen assembly 21F can be supported by the side edge of the support back frame 222F and rotated outwardly about the side edge of the support back frame 222F to adjust the orientation and position of each of the first, second and third screen units 211F, 212F, 213F of the screen assembly 21F. Further, each of the first, second and third screen units 211F, 212F, 213F of the screen assembly 21F of the screen display device 20F can be folded up on the support back frame 222F of the screen support assembly 22F, or be rotated and unfolded from the support back frame 222F for a predetermined angle into a book-like configuration.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. An extensible screen display apparatus, adapted for a mobile electronic device, wherein said extensible screen display apparatus includes:
    a power supply device; and
    a screen display device which includes a screen support assembly and at least one screen assembly which comprises at least one screen unit arranged on said screen support assembly for being communicatively connecting with the mobile electronic device to transmit at least one display information from the mobile electronic device to display on said at least one screen unit, wherein said screen support assembly is capable of electrically connecting with said at least one screen unit to provide powers thereto through said power supply device, and configured to support said at least one screen unit to be able to move between a retracted state and an extended state, wherein in the retracted state, said at least one screen unit is retracted to be received in an accommodation space defined in said screen support assembly, wherein in the extended state that said at least one screen unit is extended outwards from said screen support assembly while being supported by said screen support assembly, wherein said at least one screen assembly comprises a first screen unit and a second screen unit which are extensibly arranged through said screen support assembly and configured to be capable of communicatively connecting with the mobile electronic device, such that in the retracted state, said first and second screen units are moved to be stacked overlappedly and retained in the accommodation space, and that in the extended state, said first and second screen units are moved to extend from at least one side of said screen support assembly to extend a display interface of said at least one screen assembly and form a combined screen configuration, wherein through said screen support assembly, said screen display device is adjustable from the extended state to the retracted state by moving said first screen unit from an extended position that said first screen unit and said second screen unit are extended outward from said screen support assembly back to the accommodation space that said first screen unit is stacked and positioned behind said second screen unit overlappedly, wherein said screen support assembly includes a support base and support back frame, wherein the accommodation space is defined by said support base and said support back frame and formed in front of said support back frame, such that in the retracted state, said first and second screen units are retained in the accommodation space and stacked on said support back frame overlappedly and supported by said support base and said support back frame.

2. The extensible screen display apparatus, as claimed in claim 1, wherein in the extended state, at least a portion of each of said first and second screen units is retained in the accommodation space in a side by side manner while another portion of each of said first and second screen units is extended from a side of said support back frame outwards, such that said first screen unit and said second screen unit are able to be extended side by side in a same plane through said screen support assembly.

3. The extensible screen display apparatus, as claimed in claim 2, wherein said support base has a first track and a second track, wherein said first screen unit is movably arranged along said first track of said support base, and said second screen unit is movably arranged along said second track of said support base, wherein said first track and said second track are arranged adjacent spacedly with each other in such a manner that said first track and said second track allow said first screen unit and said screen unit to respectively and slidably move back and forth in a predetermined direction along said support base with respect to each other.

4. The extensible screen display apparatus, as claimed in claim 3, wherein said screen support assembly further includes a linkage element arranged on said support base and positioned in between said first track and said second track, such that said first screen unit and said second screen unit are able to be drivingly coupled with each other through said linkage element such that a movement of one of said first screen unit and said second screen unit drives another of said first screen unit and said second screen unit to move correspondingly in opposite direction.

5. The extensible screen display apparatus, as claimed in claim 4, wherein said linkage element is a gear and said first screen unit and said second screen unit are correspondingly arranged to be meshed with said gear opposingly.

6. The extensible screen display apparatus, as claimed in claim 5, wherein said screen display device further includes an electric driver electrically connected with said power supply device and configured to drive said gear to move to drive at least one of said first screen unit and said second screen unit to move.

7. The extensible screen display apparatus, as claimed in claim 4, wherein said support base of said screen support assembly further has a sliding slot provided therein, wherein said screen assembly is slidably coupled with said sliding slot in such a manner that said screen assembly is allowed to slidably move left and right along said sliding slot for moving between the extended state and the retracted state.

8. The extensible screen display apparatus, as claimed in claim 7, wherein said screen display device further includes an electric driver electrically connected with said power supply device and configured to drive said linkage element provided in said sliding slot to move to drive at least one of said first screen unit and said second screen unit to slide along said sliding slot.

9. The extensible screen display apparatus, as claimed in claim 4, wherein said screen display device further includes an electric driver electrically connected with said power supply device and configured to drive said linkage element to move to drive at least one of said first screen unit and said second screen unit to move.

10. An extensible screen display apparatus, adapted for a mobile electronic device, wherein said extensible screen display apparatus includes:

a power supply device; and a screen display device which includes a screen support assembly and at least one screen assembly which comprises at least one screen unit arranged on said screen support assembly for being communicatively connecting with the mobile electronic device to transmit at least one display information from the mobile electronic device to display on said at least one screen unit, wherein said screen support assembly is capable of electrically connecting with said at least one screen unit to provide powers thereto through said power supply device, and configured to support said at least one screen unit to be able to move between a retracted state and an extended state, wherein in the retracted state, said at least one screen unit is retracted to be received in an accommodation space defined in said screen support assembly, wherein in the extended state that said at least one screen unit is extended outwards from said screen support assembly while being supported by said screen support assembly, wherein said at least one screen assembly comprises a first screen unit and a second screen unit arranged on said screen support assembly, wherein said screen display device further includes at least one position driving element arranged between said screen support assembly and said first screen unit for driving said first screen unit to move in a direction towards a second screen unit through said positioning driving element until said first screen unit and said second screen unit are positioned in the same plane, wherein said screen supporting assembly includes a supporting base and a supporting back panel fixed to an upper end of said supporting base, wherein said first screen unit is fixed to said supporting back panel, wherein said position driving element includes a moving end driving element and a fixed end during element, wherein said moving end driving element is arranged on a back of said second screen unit and said fixed-end driving element is arranged on said supporting back panel, wherein said moving end driving element and said fixed end driving element are arranged opposite to each other, such that when said moving end driving element is moved to said fixed end driving element, said fixed end driving element drives said moving end driving element to move.

11. The extensible screen display apparatus, as claimed in claim 10, wherein said moving end driving element and said fixed end driving element are magnetic elements with same magnetic poles so as to repel each other and push said second screen unit from a back position behind said first screen unit forward to a front position and become aligned with said first screen unit on the same plane.

* * * * *